US010903831B2

(12) United States Patent
Iwata

(10) Patent No.: US 10,903,831 B2
(45) Date of Patent: Jan. 26, 2021

(54) SEMICONDUCTOR DEVICE

(71) Applicant: FUJI ELECTRIC CO., LTD., Kawasaki (JP)

(72) Inventor: Hideki Iwata, Azumino (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

(21) Appl. No.: 16/983,317

(22) Filed: Aug. 3, 2020

(65) Prior Publication Data

US 2020/0366281 A1 Nov. 19, 2020

Related U.S. Application Data

(63) Continuation of application No. PCT/JP2019/031498, filed on Aug. 8, 2019.

(30) Foreign Application Priority Data

Aug. 9, 2018 (JP) ................................. 2018-150573

(51) Int. Cl.
*H03K 17/082* (2006.01)
*H01L 27/02* (2006.01)

(52) U.S. Cl.
CPC ..... *H03K 17/0828* (2013.01); *H01L 27/0251* (2013.01); *H03K 2217/0027* (2013.01); *H03K 2217/0081* (2013.01)

(58) Field of Classification Search
None
See application file for complete search history.

(56) References Cited

U.S. PATENT DOCUMENTS 6,269,011 B1 7/2001 Ohshima
7,136,269 B2 11/2006 Iimura et al.
7,609,498 B2 10/2009 Iimura et al.
(Continued)

FOREIGN PATENT DOCUMENTS

JP 3143221 A 6/1991
JP 5275999 A 10/1993
(Continued)

OTHER PUBLICATIONS

International Search Report dated Nov. 5, 2019 of International Application No. PCT/JP2019/031498.

*Primary Examiner* — Cassandra F Cox

(57) ABSTRACT

A semiconductor device including: an output element including a power supply side electrode region and an output side electrode region and configured to flow main current between the power supply side electrode region and the output side electrode region; an internal circuit including a sensor circuit configured to detect an abnormality; and a package in which the output element and the internal circuit are built, the package including a primary lead terminal and a secondary lead terminal, wherein the primary lead terminal electrically draws out an intermediate node in wiring of a primary detection circuit constituting the sensor circuit to an outside, the secondary lead terminal electrically draws out a terminal of a secondary detection circuit separable from the primary detection circuit to the outside, and depending on a connection state between the primary and secondary lead terminals, a reference value for detecting the abnormality can be changed.

16 Claims, 16 Drawing Sheets

(56) References Cited

U.S. PATENT DOCUMENTS

| | | |
|---|---|---|
| 8,674,728 B2 | 3/2014 | Sogo et al. |
| 9,059,706 B2 | 6/2015 | Miyauchi et al. |
| 2003/0227730 A1 | 12/2003 | Iimura et al. |
| 2006/0044045 A1 | 3/2006 | Sakata et al. |
| 2007/0014065 A1 | 1/2007 | Iimura et al. |
| 2012/0217937 A1 | 8/2012 | Miyauchi et al. |
| 2013/0063188 A1 | 3/2013 | Sogo et al. |
| 2013/0106470 A1* | 5/2013 | Takagiwa ............ H03K 17/168 327/109 |
| 2014/0253086 A1* | 9/2014 | Rosu-Hamzescu ....... H02J 7/00 323/311 |
| 2019/0157859 A1* | 5/2019 | Ichimura ................ H03K 17/18 |

FOREIGN PATENT DOCUMENTS

| | | |
|---|---|---|
| JP | 11201830 A | 7/1999 |
| JP | 2000299628 A | 10/2000 |
| JP | 2000299629 A | 10/2000 |
| JP | 2000299927 A | 10/2000 |
| JP | 2000299928 A | 10/2000 |
| JP | 200251542 A | 2/2002 |
| JP | 2002324468 A | 11/2002 |
| JP | 2003319546 A | 11/2003 |
| JP | 200667660 A | 3/2006 |
| JP | 2008244487 A | 10/2008 |
| JP | 2012178951 A | 9/2012 |
| JP | 201362730 A | 4/2013 |

\* cited by examiner

SEMICONDUCTOR DEVICE

CROSS-REFERENCE TO RELATED APPLICATION

This application is a continuation application filed under 35 U.S.C. § 111(a) of International Patent Application No. PCT/JP2019/031498, filed on Aug. 8, 2019, and claims the priority of Japanese Patent Application No. 2018-150573, filed on Aug. 9, 2018, the contents of both of which are incorporated herein by reference.

BACKGROUND OF THE INVENTION

1. Field of the Invention

The present invention relates to semiconductor devices, more particularly to a semiconductor device into which a semiconductor integrated circuit such as a power semiconductor switch is built.

2. Description of the Related Art

Conventionally, as semiconductor devices for power control, semiconductor devices into each of which a semiconductor integrated circuit like an intelligent power switch (IPS) into which a power switching element and peripheral circuits, such as a control circuit and a protection circuit, are integrated is built have been developed. In IPSes, various protection circuits, such as an overcurrent protection circuit, an over temperature protection circuit, an undervoltage protection circuit, and an overvoltage protection circuit, are implemented. For example, as one of such protection circuits, an overcurrent detection circuit is disposed. Detection of overcurrent is performed by monitoring current flowing from a sense element to a constant current element and comparing the monitored current with current flowing from an output element to a load. The overcurrent detection circuit detecting overcurrent is integrated into a semiconductor chip. A constant current value of the constant current element employed in a design specification is fixed as a reference value for the overcurrent detection. Therefore, even when it becomes necessary to change a protection level against overcurrent, it is difficult to change the protection level.

JP H5-275999 A describes that, though a reference value of overcurrent is fixed, a detection level of overcurrent is changed as needed basis by changing the resistance value of an external resistor for detecting overcurrent. JP 2013-62730 A describes that, when driving voltage of an output element has varied, a reference value for overcurrent detection is changed by switching resistors for detecting overcurrent in an overcurrent detection circuit.

Depending on uses of an IPS, there is a case where a reference value for overcurrent detection is desired to be set high in order to increase the conduction capacity. Conventionally, it has been required to cope with such cases by separately preparing a product in which, by increasing a constant current value of an overcurrent detection element, a reference value for overcurrent detection is increased. Similarly, when a reference value for operating state detection, such as over temperature detection, constant voltage detection, and overvoltage detection, is to be changed, it has been required to separately prepare a product in which the specification of a protection circuit is changed according to change in the reference value for the operating state detection.

SUMMARY OF INVENTION

The present invention has been made in view of the problem as described above, and an object of the present invention is to provide an implementation structure of a semiconductor device capable of changing a reference value for abnormality detection.

In order to solve the above problem, according to an aspect of the present invention, there is provided a semiconductor device including: an output element including a power supply side electrode region electrically connected to a power supply side main electrode and an output side electrode region electrically connected to an output side main electrode and configured to flow main current between the power supply side electrode region and the output side electrode region; an internal circuit including a sensor circuit configured to detect an abnormality; and a package in which the output element and the internal circuit are built, the package including a primary lead terminal and a secondary lead terminal, wherein the primary lead terminal electrically draws out an intermediate node in wiring of a primary detection circuit constituting the sensor circuit to an outside, the secondary lead terminal electrically draws out a terminal of a secondary detection circuit separable from the primary detection circuit to the outside and can be electrically connected to the primary lead terminal on the outside, and by changing circuit connection of the sensor circuit based on a connection state between the primary lead terminal and the secondary lead terminal, at least a portion of the internal circuit functions as a reference value change circuit changing a reference value for detecting the abnormality.

According to one aspect of the present invention, it is possible to provide an implementation structure of a semiconductor device capable of changing a reference value for abnormality detection.

DETAILED DESCRIPTION

Figure 1:
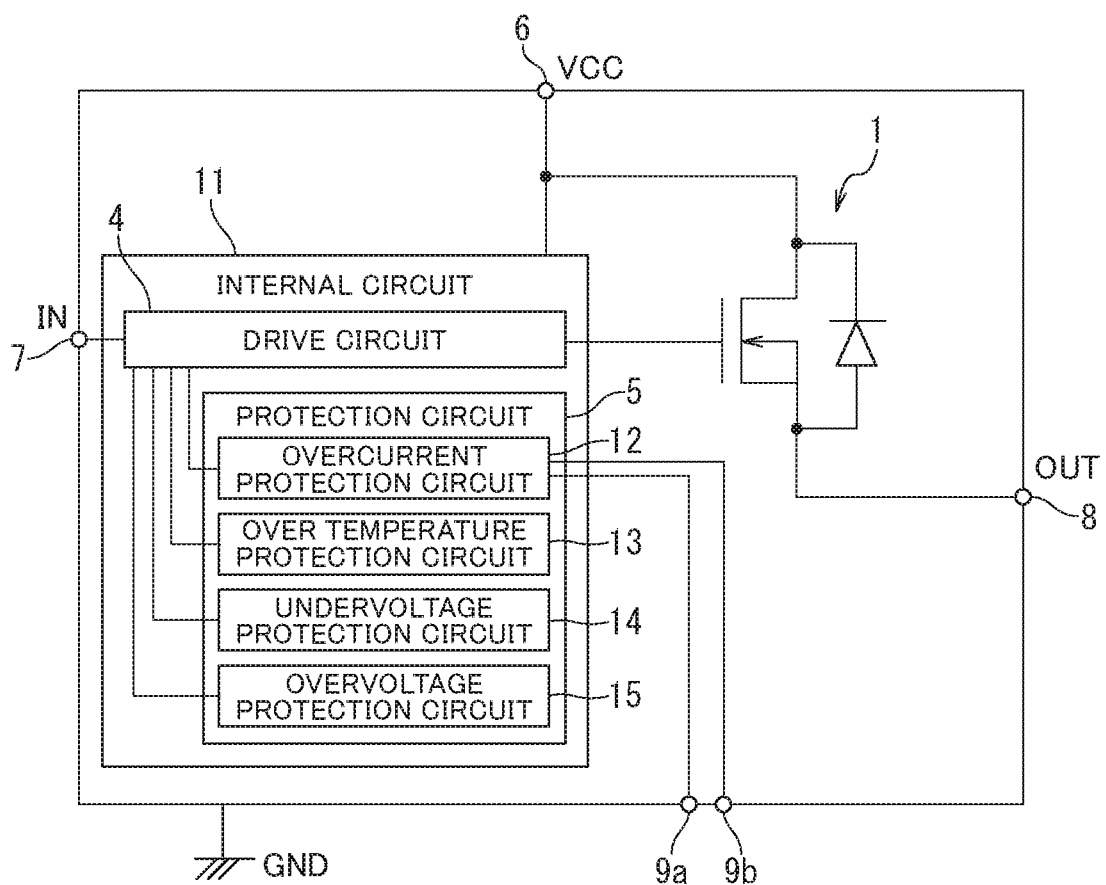
FIG. 1 is a block diagram illustrative of an example of a semiconductor device according to a first embodiment of the present invention.

First to fifth embodiments of the present invention will be described below. In the following description of the drawings, the same or similar portions are denoted by the same or similar reference numerals. However, it should be noted that the drawings are schematic and a relation between a thickness and a flat dimension, a ratio of thicknesses of respective devices or members, and the like are different from actual ones. Accordingly, specific thicknesses and dimensions should be determined with reference to the following description. In addition, it is certain that some portions have different dimensional relations and ratios between the drawings.

The directions of "right and left" and "up and down" in the following description of first to fifth embodiments are merely definitions for convenience of description, and do not limit the technical idea of the present invention. Thus, it is needless to say that, for example, when the plane of paper is rotated 90 degrees, the "right and left" and the "up and down" are interpreted in an interchanging manner, and, when the plane of paper is rotated 180 degrees, the "left" becomes the "right" and the "right" becomes the "left". In addition, in the following description, a case where the first conductivity type is p-type and the second conductivity type is n-type will be described in an exemplifying manner. However, choosing the relationship between the conductivity types in a reverse manner, the first conductivity type and the second conductivity type may be set to be n-type and p-type, respectively. Signs+ and − that are appended to the letter p or n mean that semiconductor regions indicated by the letters with the signs+ and − are semiconductor region that have comparatively higher and lower impurity densities than semiconductor regions indicated by the letters without the signs+ and −, respectively. However, two semiconductor regions being provided with the same letters p does not necessarily mean that the impurity densities of the respective semiconductor regions are exactly the same.

Into semiconductor integrated circuits built into semiconductor devices according the following first to fifth embodiments, a plurality of semiconductor elements are integrated. A "power supply side main electrode" of an output element 1 that is built into a semiconductor device means a main electrode on the side connected to a power supply. An "output side main electrode" means a main electrode that does not server as the above-described power supply side main electrode and that is on the side connected to a load. A "power supply side electrode region" of the output element 1 means, in a metal-insulator-semiconductor field effect transistor (MISFET) or a metal-insulator-semiconductor static induction transistor (MISSIT), a semiconductor region that is either the source region or the drain region and that is ohmic-connected to the power supply side main electrode. In an insulate gate bipolar transistor (IGBT), the "power supply side electrode region" means a semiconductor region that serves as either the emitter region or the collector region. In a static induction (SI) thyristor or a gate turn-off (GTO) thyristor, the "power supply side electrode region" means a semiconductor region that serves as either the anode region or the cathode region. An "output side electrode region" of the output element 1 means, in an FET or an SIT, a semiconductor region that is either the source region or the drain region not serving as the above-described power supply side electrode region and that is ohmic-connected to the output side main electrode. In an IGBT, the "output side electrode region" means a semiconductor region that serves as either the emitter region or the collector region and that does not serve as the above-described power supply side electrode region. In an SI thyristor or a GTO thyristor, the "output side electrode region" means a region that serves as either the anode region or the cathode region and that does not serve as the above-described power supply side electrode region. As described above, when the "power supply side electrode region" of the output element 1 is the source region, the "output side electrode region" means the drain region. When the "power supply side electrode region" is the emitter region, the "output side electrode region" means the collector region. When the "power supply side electrode region" is the anode region, the "output side electrode region" means the cathode region. In an FET or the like having a symmetrical structure, interchanging bias settings with each other enables the function of the "power supply side electrode region" and the function of the "output side electrode region" to be interchanged with each other.

"One main electrode region" of each semiconductor element that constitutes an internal circuit 11 built into a semiconductor device, the one main electrode region meaning a main electrode on the side connected to a load or an overcurrent control unit, means, in a MISFET or a MISSIT, the source region or the drain region. In an IGBT, the "one main electrode region" means a semiconductor region that serves as either the emitter region or the collector region. In an SI thyristor or a GTO thyristor, the "one main electrode region" means a semiconductor region that serves as either the anode region or the cathode region. "The other main electrode region" means, in an FET or an SIT, a semiconductor region that is either the source region or the drain region and that does not serve as the above-described one main electrode region. In an IGBT, "the other main electrode region" means a region that serves as either the emitter region or the collector region and that does not serve as the above-described one main electrode region. In an SI thyristor or a GTO thyristor, "the other main electrode region" means a region that serves as either the anode region or the cathode region and that does not serve as the above-described one main electrode region. In an FET or the like having a symmetrical structure, interchanging bias settings with each other enables the function of "one main electrode region" and the function of "the other main electrode region" to be interchanged with each other.

Similarly, in the descriptions of the first to fifth embodiments, a "control electrode" means an electrode to control main current flowing between a power supply side electrode region and an output side electrode region or between one main electrode region and the other main electrode region. For example, in an FET or an SIT, the gate electrode to control main current flowing between the source region and the drain region corresponds to the control electrode. In an IGBT, the gate electrode to control main current flowing between the emitter region and the collector region also corresponds to the control electrode. In an SI thyristor or a GTO thyristor, the gate electrode to control main current flowing between the anode region and the cathode region corresponds to the control electrode. In a BJT, the base electrode to control main current flowing between the emitter region and the collector region corresponds to the control electrode.

First Embodiment

Figure 2:
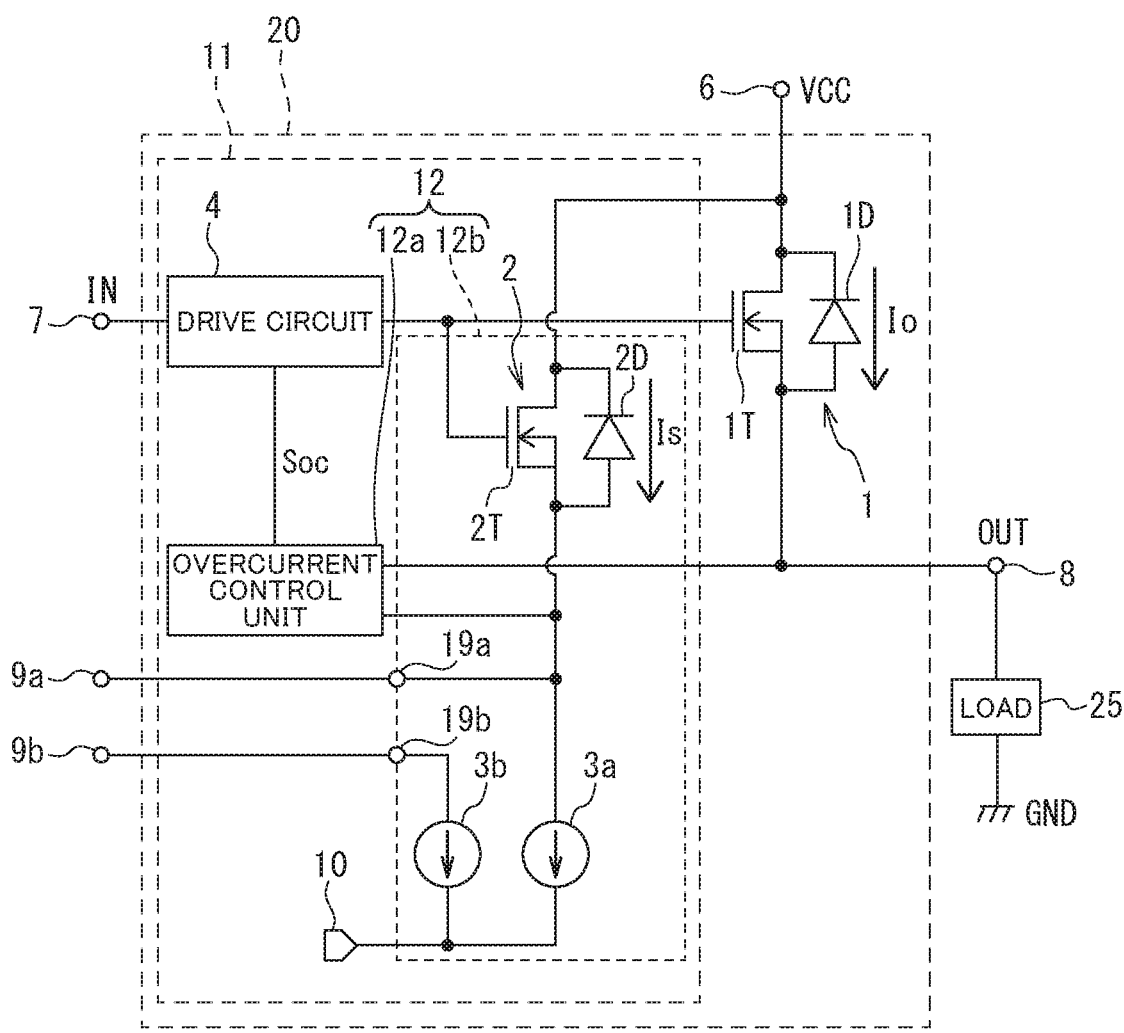
FIG. 2 is a circuit diagram illustrative of an example of the semiconductor device according to the first embodiment of the present invention.

A semiconductor device according to a first embodiment of the present invention has, as schematically illustrated in a block diagram in FIG. 1, a package structure that contains an output element 1 and an internal circuit 11 as major elements. The internal circuit 11 includes a drive circuit 4, a protection circuit 5, and the like. The protection circuit 5 includes an overcurrent protection circuit 12, an over temperature protection circuit 13, an undervoltage protection circuit 14, an overvoltage protection circuit 15, and the like. In the semiconductor device according to the first embodiment, the overcurrent protection circuit 12 is electrically connected to a primary lead terminal 9a and a secondary lead terminal 9b of a package. Since keeping open-circuited or short-circuiting the primary lead terminal 9a and the secondary lead terminal 9b enables a reference value for overcurrent detection to be changed arbitrarily, the overcurrent protection circuit 12 functions as a "reference value change circuit". The overcurrent protection circuit 12 includes, as illustrated in FIG. 2, an overcurrent control unit 12a, a sensor circuit 12b, and the like. The sensor circuit 12b includes a sense element 2, a primary overcurrent detection element 3a serving as a "primary overcurrent detection circuit (primary detection circuit)", and a secondary overcurrent detection element 3b serving as a "secondary overcurrent detection circuit (secondary detection circuit)" and detects overcurrent as an "abnormality" of the output element 1. As the primary overcurrent detection element 3a and the secondary overcurrent detection element 3b, constant current elements can be used. As the semiconductor device according to the first embodiment, a monolithic integrated circuit (IC) in which the output element 1 and the internal circuit 11 are formed in a semiconductor chip 20 as a monolithic structure will be described in an exemplifying manner. The monolithic IC is only an exemplification, and a semiconductor device into which a semiconductor integrated circuit according to the first embodiment is built may thus be configured as a hybrid IC or the like in which the output element 1 and the internal circuit 11 are respectively formed in separate semiconductor chips.

As illustrated in FIG. 2, the output element 1 has the power supply side main electrode (drain electrode) electrically connecting to an external power supply via a lead terminal 6 for power supply and the output side main electrode (source electrode) electrically connecting to a load 25, such as a solenoid, via a lead terminal 8 for output. The sense element 2 in the sensor circuit 12b has one main electrode region (drain region) electrically connecting to the drain electrode of the output element 1 and the other main electrode region (source region) electrically connecting to the anode of the primary overcurrent detection element 3a. The primary overcurrent detection element 3a has the anode electrically connecting to the primary lead terminal 9a via a connection node 19a and the cathode electrically connecting to a ground wiring 10 that is a ground wiring or an internal ground wiring (hereinafter, also simply referred to as a "ground wiring"). The voltage of the internal ground is, for example, a voltage obtained by subtracting 5 V from the voltage of VCC. The secondary overcurrent detection element 3b has the anode electrically connecting to the secondary lead terminal 9b of the package via a connection node 19b and the cathode electrically connecting to the ground wiring 10. The drive circuit 4 that is electrically connected to a lead terminal 7 for input of the package electrically connects to the respective control electrodes of the output element 1 and the sense element 2. The overcurrent control unit 12a electrically connects to the source electrode of the output element 1 and the source electrode of the sense element 2 and the drive circuit 4.

As illustrated in FIG. 2, the output element 1 includes an output transistor 1T and an internal diode 1D that is reversely connected to the output transistor 1T. The sense element 2 includes a sense transistor 2T and an internal diode 2D that is reversely connected to the sense transistor 2T. As the output transistor 1T of the output element 1, a vertical semiconductor element, such as a MISFET, a MISSIT, and an IGBT, that has an insulated gate structure and in which main current flows in the depth direction (thickness direction) of the semiconductor chip 20 is suitable. Although the sense transistor 2T in the sense element 2 may have a vertical structure or a lateral structure, it is, as can be understood from the following description, preferable that the sense transistor 2T, as with the output transistor 1T, have a vertical structure. In the following description, a case where, as the output transistor 1T and the sense transistor 2T, a vertical MISFET that has an insulated gate structure using silicon (Si) is employed will be described in an exemplifying manner.

Note that the MIS transistor is a concept including a MISFET, MISSIT, and the like. While a MOS transistor is a transistor in which a silicon oxide ($SiO_2$) film is used as a gate insulating film, the "MIS transistor" means a more inclusive insulated gate type transistor in which an insulating film other than a $SiO_2$ film is used as a gate insulating film. For the gate insulating film of a MIS transistor, a silicon oxynitride (SiON) film, a strontium oxide (SrO) film, a silicon nitride ($Si_3N_4$) film, or an aluminum oxide ($Al_2O_3$) film can be used. Alternatively, a magnesium oxide (MgO) film, an yttrium oxide ($Y_2O_3$) film, a hafnium oxide ($HfO_2$) film, a zirconium oxide ($ZrO_2$) film, a tantalum oxide ($Ta_2O_5$) film, or a bismuth oxide ($Bi_2O_3$) film can also be used for the gate insulating film. Further, a composite film or the like that is produced by selecting a plurality of films out of the above-described single layer films and laminating the plurality of films can also be used. As a semiconductor material, in addition to Si, semiconductor materials, including silicon carbide (SiC), gallium nitride (GaN), diamond, aluminum nitride (AlN), and the like, having a band gap wider than the band gap of 1.1 eV of Si can be respectively used.

As the primary overcurrent detection element 3a and the secondary overcurrent detection element 3b, depression type MOS transistors each of which has the gate and the source electrically connected to each other can be used. As illustrated in FIG. 2, the overcurrent control unit 12a is electrically connected to the output side main electrode (source electrode) side of the output element 1 and the other main electrode region of the sense element 2 and acquires output current Io and sense current Is, respectively. The output current Io flows to the external load 25 that is electrically connected to the lead terminal 8 for output. Regarding the sense current Is, when both the primary lead terminal 9a and the secondary lead terminal 9b are open-circuited, only the primary overcurrent detection element 3a is electrically connected to the other main electrode region of the sense transistor 2T. Therefore, the sense current Is flowing through the sense element 2 becomes a constant current value defined by the primary overcurrent detection element 3a. On the other hand, when the primary lead terminal 9a and the secondary lead terminal 9b are short-circuited to each other, the primary overcurrent detection element 3a and the secondary overcurrent detection element 3b are connected in parallel and are respectively electrically connected to the other main electrode region of the sense transistor 2T. Therefore, the sense current Is flowing through the sense element 2 becomes the sum of constant current values respectively defined by the primary overcurrent detection element 3a and the secondary overcurrent detection element 3b.

The sense current Is of the sense element 2 is defined by a constant current value of the primary overcurrent detection element 3a or the sum of constant current values of the primary overcurrent detection element 3a and the secondary overcurrent detection element 3b. The overcurrent control unit 12a compares the output current Io with the value of the sense current Is as a reference value and thereby detects overcurrent. For example, the overcurrent control unit 12a computes a current ratio of the value of the sense current Is to the value of the output current Io and, when the current ratio becomes equal to or greater than a predetermined value, determines that the output current Io has reached an overcurrent level at which protection is required and transmits an overcurrent detection signal Soc to the drive circuit 4.

The drive circuit 4 supplies, based on a control signal supplied to the lead terminal 7 for input, the respective control electrodes (gate electrodes) of the output element 1 and the sense element 2 with control voltage and thereby brings the output element 1 and the sense element 2 into a conducting state. Upon acquisition of the overcurrent detection signal Soc from the overcurrent control unit 12a, the drive circuit 4 cuts off the control voltage to the output element 1 and the sense element 2. In this manner, the output element 1 can be protected from overcurrent.

Figure 3:
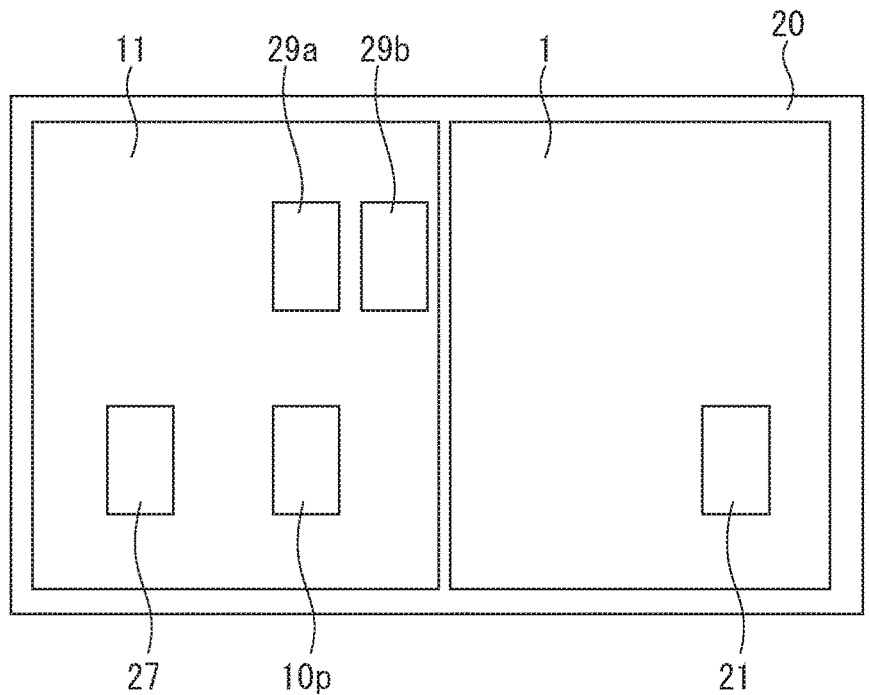
FIG. 3 is a schematic plan view illustrative of an example of a semiconductor integrated circuit built into the semiconductor device according to the first embodiment of the present invention.

As illustrated in FIG. 3, in the semiconductor device according to the first embodiment, the output element 1 and the internal circuit 11 are integrated in the common semiconductor chip 20 in a monolithic manner. On the upper surface of the semiconductor chip 20 in FIG. 3, a front surface electrode pad 21, a first detection element pad 29a and a second detection element pad 29b, an input pad 27, a ground wiring pad 10p, and the like are disposed. The front surface electrode pad 21 is an output side main electrode that is electrically connected to the output side electrode region of the output element 1. When the output side main electrode of the output element 1 is the source electrode, the output side electrode region is the source region. The first detection element pad 29a is electrically connected to the anode of the primary overcurrent detection element 3a via the connection node 19a. The second detection element pad 29b is electrically connected to the anode of the secondary overcurrent detection element 3b via the connection node 19b. The input pad 27 is electrically connected to the drive circuit 4. The ground wiring pad 10p is electrically connected to the ground wiring 10. Note that, although illustration is omitted, on the back surface of the semiconductor chip 20, the power supply side electrode region of the output element 1 and the one main electrode region of the sense element 2 are formed in an exposed manner. Since, when the output side main electrode of the output element 1 is the source electrode, the drain electrode is selected as the power supply side main electrode, the power supply side electrode region is the drain region.

Figure 4:
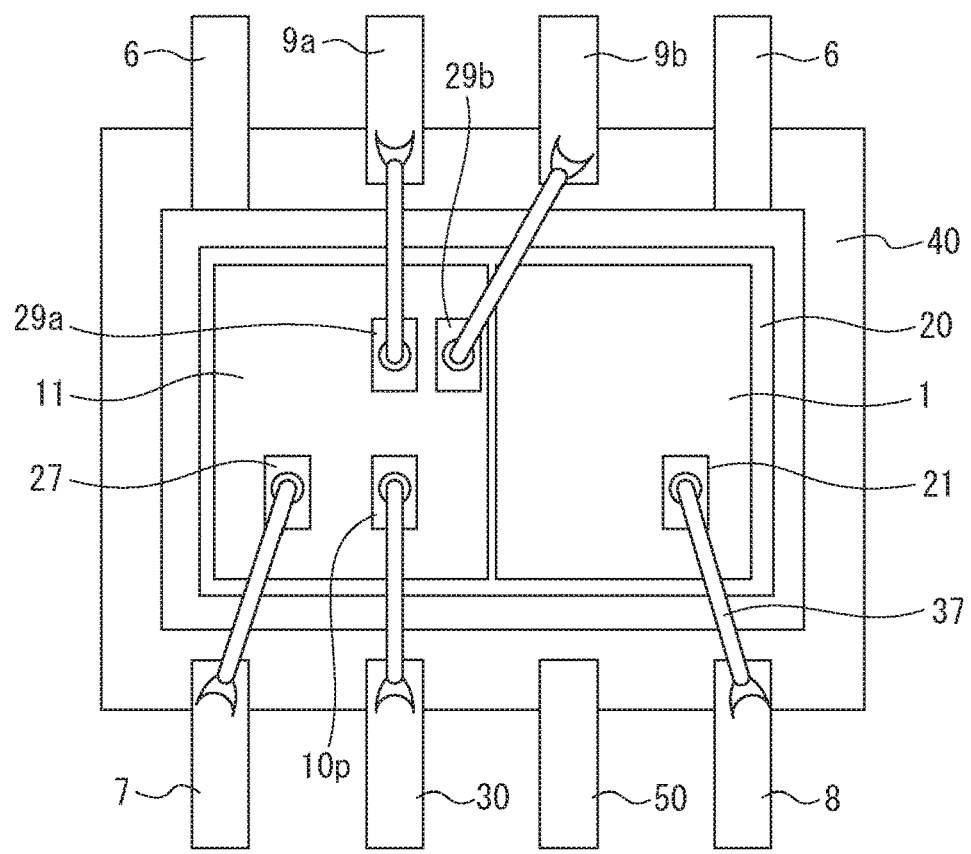
FIG. 4 is a circuit diagram descriptive of an example of structure of a package on which the semiconductor integrated circuit according to the first embodiment of the present invention is mounted.

As illustrated in FIG. 4, the semiconductor chip 20 is arranged in such a way that the power supply side electrode region of the output element 1 and the one main electrode region of the sense element 2 are brought into metallurgical contact with the upper surface of a conductor plate of a package 40, such as a lead frame. On the back surface side of the semiconductor chip 20, the power supply side electrode region of the output element 1 and the one main electrode region of the sense element 2 are electrically connected to the lead terminal 6 for power supply, to which the external power supply VCC is supplied. The front surface electrode pad (output side main electrode) 21 of the output element 1, which is exposed on the upper surface of the semiconductor chip 20 in FIGS. 3 and 4, is electrically connected to the lead terminal 8 for output via a wiring member 37, such as a bonding wire. The first detection element pad 29a of the primary overcurrent detection element 3a, which is exposed on the upper surface of the semiconductor chip 20, is electrically connected to the primary lead terminal 9a via a wiring member 37. The secondary detection element pad 29b of the secondary overcurrent detection element 3b, which is exposed on the upper surface of the semiconductor chip 20, is electrically connected to the secondary lead terminal 9b via a wiring member 37. The input pad 27 of the drive circuit 4, which is exposed on the upper surface of the semiconductor chip 20, is electrically connected to the lead terminal 7 for input via a wiring member 37. The ground wiring pad 10p of the ground wiring 10, which is exposed on the upper surface of the semiconductor chip 20, is electrically connected to the ground terminal 30 via a wiring member 37. Note that, in the semiconductor device according to the first embodiment, a case where a terminal 50 is an idle terminal is exemplified.

Figure 6:
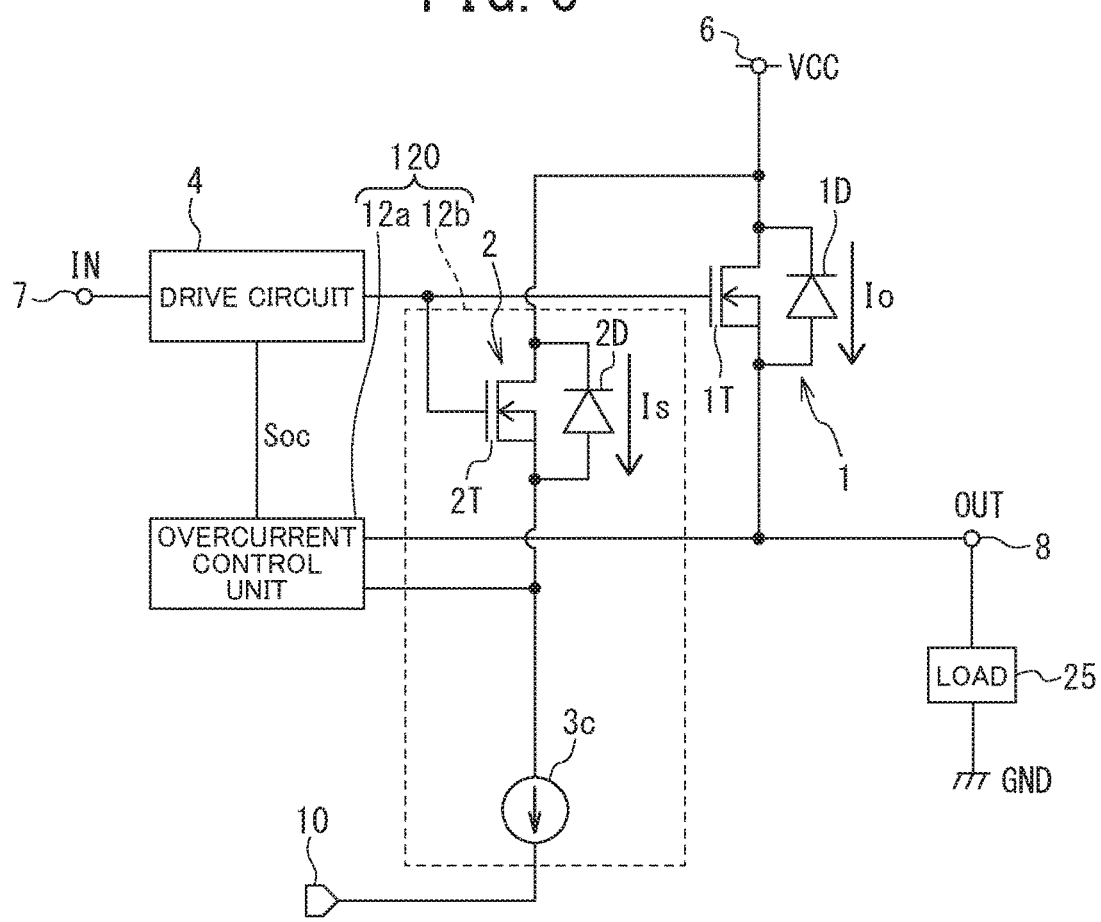
FIG. 6 is a circuit diagram illustrative of an example of a conventional semiconductor device.
Figure 7:
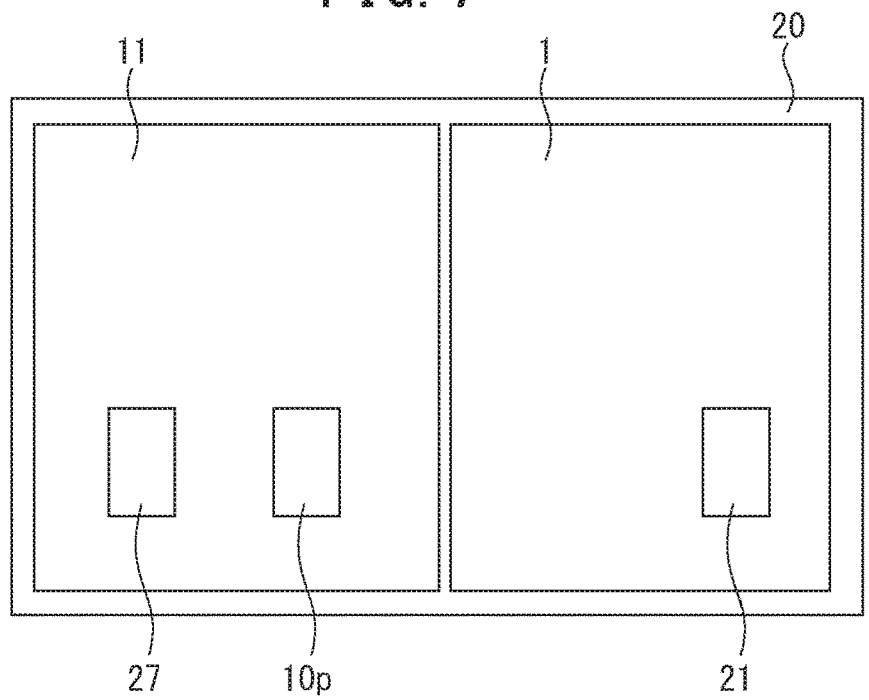
FIG. 7 is a schematic plan view illustrative of an example of a semiconductor integrated circuit used for the conventional semiconductor device.

In a conventional IPS, as illustrated in FIG. 6, a single overcurrent detection element 3c is used. The overcurrent detection element 3c only has to be arranged between a sense element 2 and a ground wiring 10 and does not have to be electrically drawn out to a lead frame terminal of a package out of a semiconductor chip 20. Therefore, as illustrated in FIG. 7, the conventional IPS has a configuration in which no pad electrically connecting to the anode of the overcurrent detection element 3c is disposed on the upper surface of the semiconductor chip 20. Therefore, when a reference value for overcurrent detection is required to be set high in order to increase the conduction capacity, the reference value cannot be changed.

Figure 5:
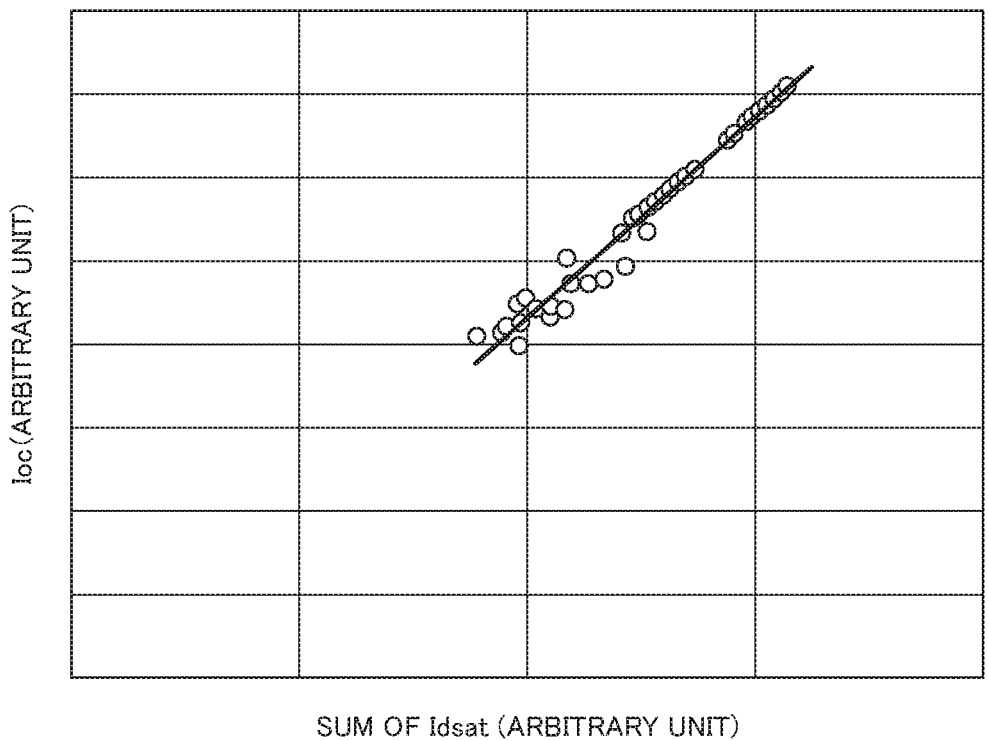
FIG. 5 is a diagram illustrative of a relationship between overcurrent values and current values of an overcurrent detection element in the semiconductor device according to the first embodiment of the present invention.

In FIG. 5, a relationship between the sum (arbitrary unit) of constant current values (saturation current values) Idsat when a plurality of depression type MOS transistors the gate and source of each of which are electrically connected to each other (hereinafter, also simply referred to as a "depression type MOS transistor") and that are connected in parallel to one another are used as an overcurrent detection element 3c and detected overcurrent Ioc (arbitrary unit) of the output element 1 is illustrated. As illustrated in FIG. 5, the overcurrent Ioc on the ordinate and the sum of constant current values Idsat of the depression type MOS transistors on the abscissa are in an approximately proportional relationship. Therefore, increasing the sum of constant current values Idsat by use of a plurality of depression type MOS transistors enables the reference value for overcurrent of the output element 1 to be increased. As described above, in the semiconductor device according to the first embodiment, the primary overcurrent detection element 3a and the secondary overcurrent detection element 3b are disposed and the anodes of the respective detection elements are electrically drawn out to the outside of the package 40 by way of the primary lead terminal 9a and the secondary lead terminal 9b of the package 40. Using the primary lead terminal 9a and the secondary lead terminal 9b that are kept open-circuited causes only the primary overcurrent detection element 3a to be electrically connected to the other main electrode region of the sense element 2. Short-circuiting the primary lead terminal 9a and the secondary lead terminal 9b to each other outside the package 40 enables circuit connections to be changed in such a way that the primary overcurrent detection element 3a and the secondary overcurrent detection element 3b are connected in parallel to the other main electrode region of the sense element 2. Since circuit connections can be arbitrarily changed outside the package 40, it is possible to arbitrarily change the reference value for overcurrent according to the status of use of the semiconductor device according to the first embodiment.

Note that the number of overcurrent detection elements used for overcurrent detection is not limited to two, and three or more overcurrent detection elements may be used. In that case, it is only necessary to form anode pads each of which electrically connects to the anode of one of the overcurrent detection elements, on the upper surface of the semiconductor chip 20. Using three or more overcurrent detection elements causes the degree of freedom in changing circuit connections on the outside of the package 40 to be increased. Since using three or more overcurrent detection elements enables change in circuit connections to be performed more freely, it becomes possible to change the reference value for overcurrent with a high degree of freedom according to the status of use of the semiconductor device according to the first embodiment.

Second Embodiment

Figure 8:
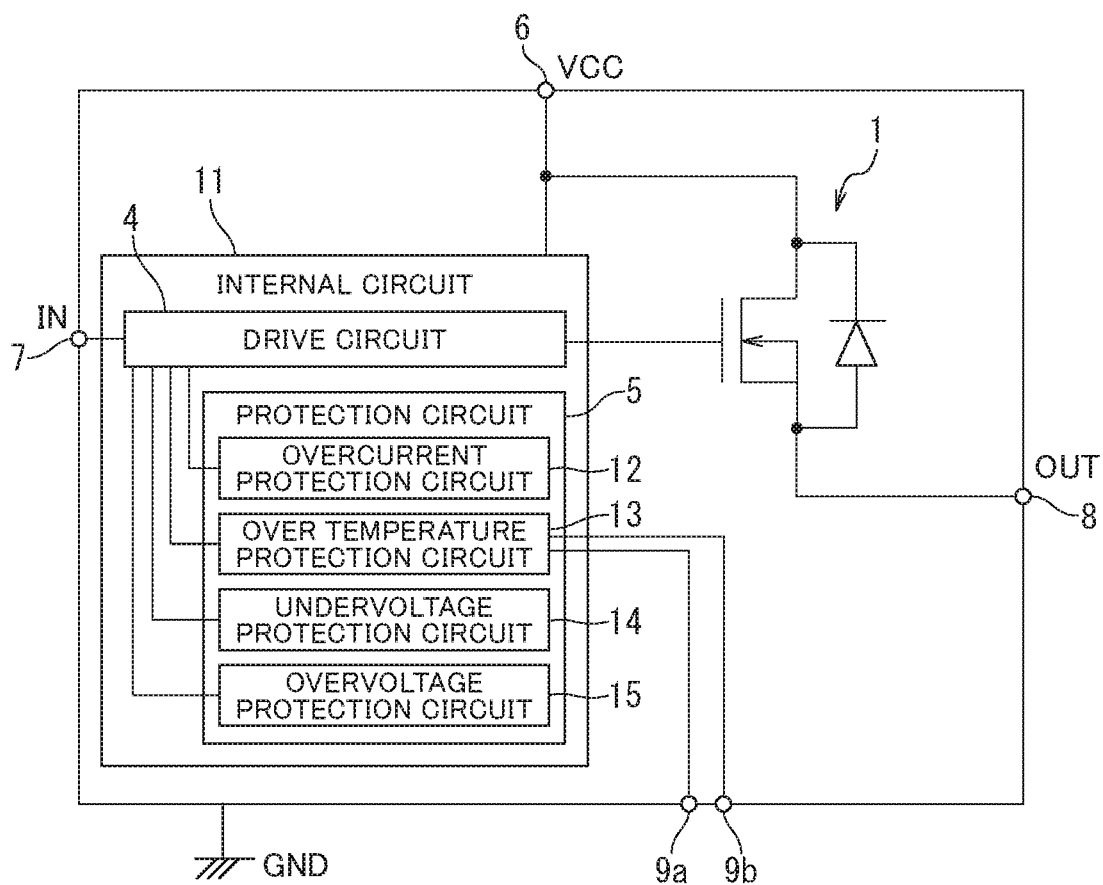
FIG. 8 is a block diagram illustrative of an example of a semiconductor device according to a second embodiment of the present invention.

In a semiconductor device according to a second embodiment of the present invention, as illustrated in FIG. 8, an over temperature protection circuit 13 in a protection circuit 5 is electrically connected to a primary lead terminal 9a and a secondary lead terminal 9b of a package. Keeping open-circuited or short-circuiting the primary lead terminal 9a and the secondary lead terminal 9b enables a reference value for over temperature detection in the over temperature protection circuit 13 to be changed arbitrarily. The semiconductor device according to the second embodiment differs from the first embodiment in that the over temperature protection circuit 13 in the protection circuit 5 is electrically connected to the primary lead terminal 9a and the secondary lead terminal 9b and functions as a "reference value change circuit" that is capable of changing a reference value used in an internal circuit. Since the configuration of the other constituent components is the same as that of the first embodiment, a redundant description thereof will be omitted.

Figure 9:
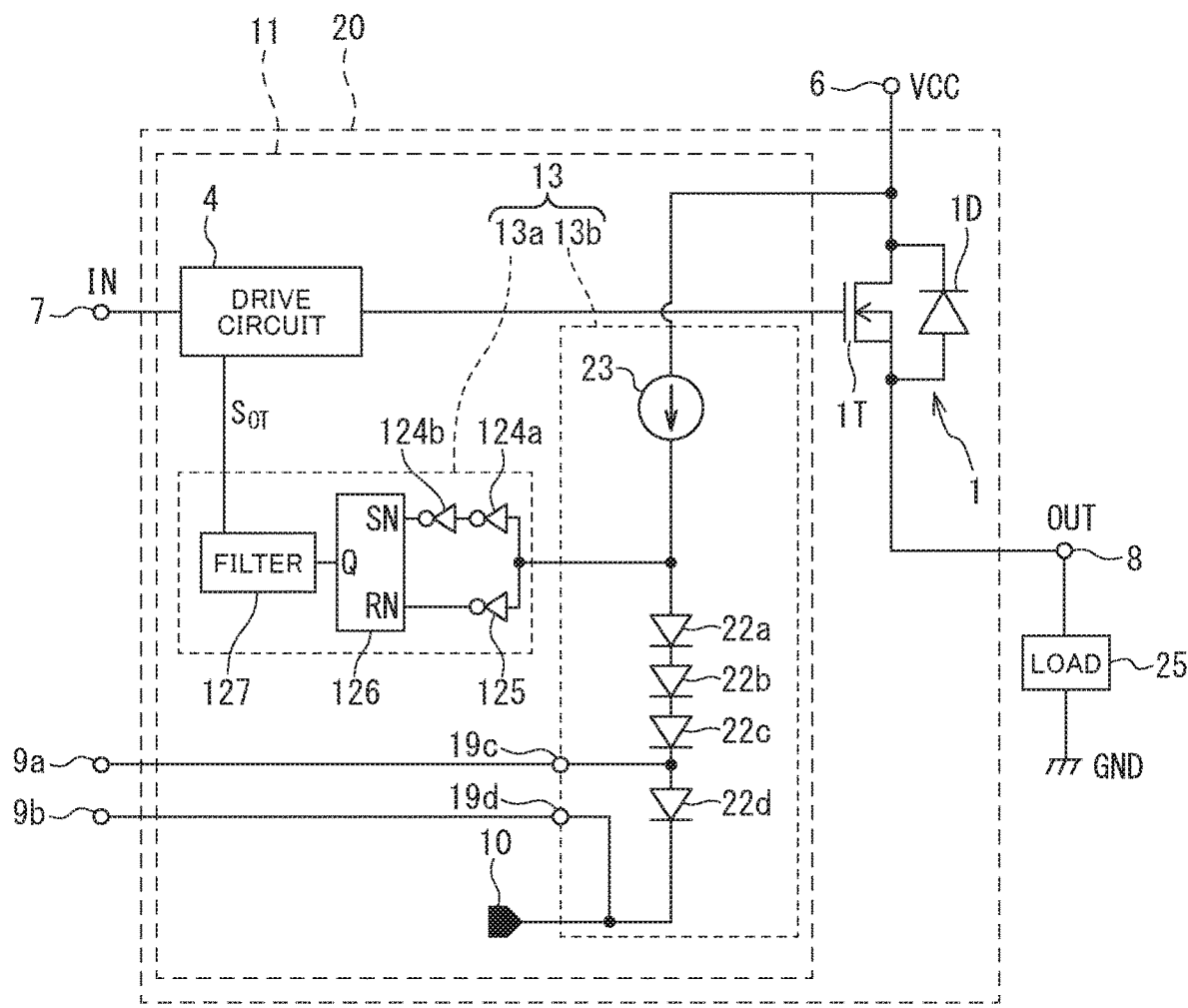
FIG. 9 is a circuit diagram illustrative of an example of the semiconductor device according to the second embodiment of the present invention.

The over temperature protection circuit 13 includes, as illustrated in FIG. 9, a temperature control unit 13a, a sensor circuit 13b, and the like. The temperature control unit 13a includes a first inverter 124a, a second inverter 124b, and a third inverter 125, a latch circuit 126, and a filter unit 127 and detects over temperature as an "abnormality" of an output element 1. The sensor circuit 13b includes a constant current element 23, a first temperature sensor 22a, a second temperature sensor 22b, a third temperature sensor 22c, a secondary over temperature detection element (temperature sensor) 22d, and the like and detects over temperature of the output element 1. A series connection of the first temperature sensor 22a, the second temperature sensor 22b, and the third temperature sensor 22c constitutes a "primary over temperature detection circuit (primary detection circuit)". The fourth temperature sensor 22d that constitutes a "secondary over temperature detection circuit (secondary detection circuit)" is connected in series to the first temperature sensor 22a, the second temperature sensor 22b, and the third temperature sensor 22c. In order to improve the precision of the over temperature detection, it is preferable that the sensor circuit 13b, in particular, the first temperature sensor 22a, the second temperature sensor 22b, the third temperature sensor 22c, and the fourth temperature sensor 22d, be arranged in the vicinity of the output element 1.

As illustrated in FIG. 9, the constant current element 23 in the sensor circuit 13b has the anode electrically connecting to the drain electrode of the output element 1 and the cathode electrically connecting to the anode of the first temperature sensor 22a. The third temperature sensor 22c has the cathode electrically connecting to the primary lead terminal 9a via a connection node 19c. The cathode of the third temperature sensor 22c electrically connects to the anode of the fourth temperature sensor 22d. The fourth temperature sensor 22d has the cathode electrically connecting to the secondary lead terminal 9b via a connection node 19b and also electrically connecting to a ground wiring 10.

Each of the first inverter 124a, the second inverter 124b, and the third inverter 125 in the temperature control unit 13a can be constructed using a logical negation gate (NOT gate) or the like, which is constructed using a combination of a p-type or n-type MOS transistor and a resistor or CMOS transistors. As the latch circuit 126, a reset-set (RS) flip-flop or the like can be employed. The first inverter 124a and the third inverter 125 have the inputs thereof electrically connected to the anode of the first temperature sensor 22a. The output of the second inverter 124b, which is connected to the first inverter 124a in series, is electrically connected to an input terminal (negative-logic set terminal, hereinafter, also simply referred to as a "set terminal") SN of the latch circuit 126. The output of the third inverter 125 is electrically connected to an input terminal (negative-logic reset terminal, hereinafter, also simply referred to as a "reset terminal") RN of the latch circuit 126. An output terminal Q of the latch circuit 126 is electrically connected to a drive circuit 4 via the filter unit 127.

As the constant current element 23, a constant current element such as a depression type MOS transistor the gate and source of which are electrically connected to each other can be used. As the first temperature sensor 22a, the second temperature sensor 22b, the third temperature sensor 22c, and the fourth temperature sensor 22d, Si diodes or the like can be used. The forward voltage (Vf) of a Si diode has a temperature coefficient of approximately −2 mV/° C. to −2.5 mV/° C., and the forward voltage (Vf) drops as temperature increases. By measuring voltage between the anode and cathode of a Si diode while flowing constant forward current through the Si diode, temperature can be detected. In the second embodiment, constant current is flowed from the constant current element 23, and, based on voltage between the anode of the first temperature sensor 22a and the ground wiring 10, the temperature of the output element 1 can be detected. In FIG. 9, keeping the primary lead terminal 9a and the secondary lead terminal 9b open-circuited causes a series connection of four stages of temperature sensors made up of the first temperature sensor 22a, the second temperature sensor 22b, the third temperature sensor 22c, and the fourth temperature sensor 22d to be formed. On the other hand, short-circuiting the primary lead terminal 9a and the secondary lead terminal 9b to each other causes a series connection of three stages of temperature sensors made up of the first temperature sensor 22a, the second temperature sensor 22b, and the third temperature sensor 22c to be formed. As described above, output voltage from the four stage configuration made up of the first temperature sensor 22a, the second temperature sensor 22b, the third temperature sensor 22c, and the fourth temperature sensor 22d or the three stage configuration made up of the first temperature sensor 22a, the second temperature sensor 22b, and the third temperature sensor 22c is transmitted to the temperature control unit 13a as a temperature detection signal.

Figure 10:
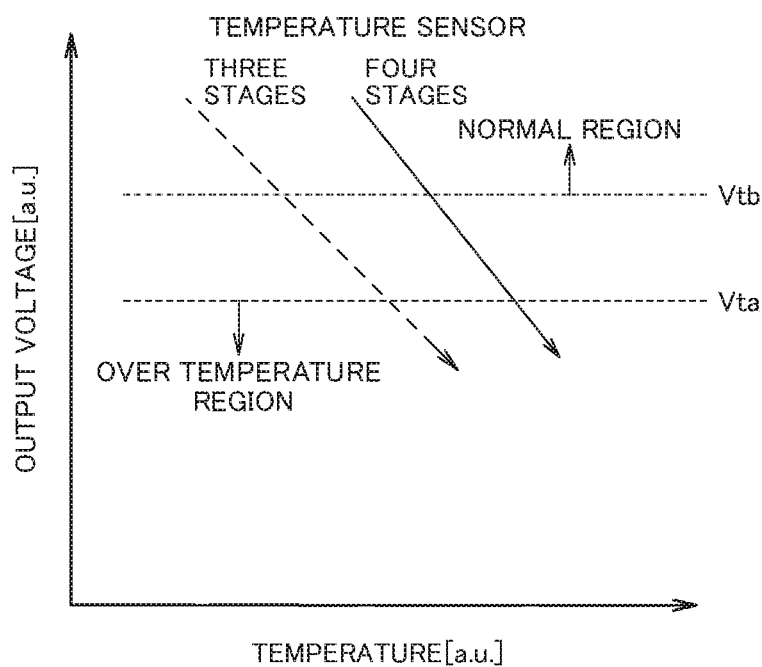
FIG. 10 is a diagram illustrative of an example of operation of an over temperature protection circuit according to the second embodiment of the present invention.
Figure 11:
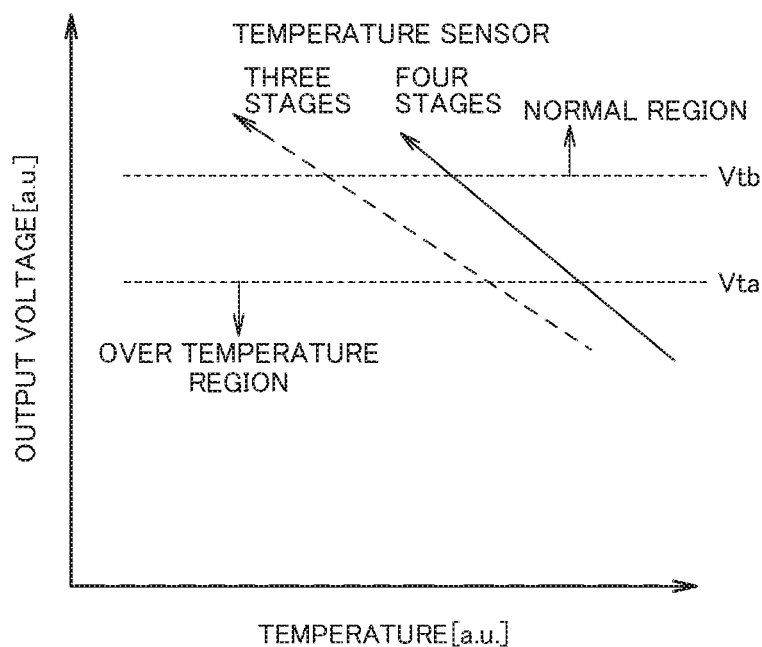
FIG. 11 is a diagram illustrative of another example of the operation of the over temperature protection circuit according to the second embodiment of the present invention.

As illustrated in FIGS. 10 and 11, a detection voltage threshold value Vta is set to the first inverter 124a and the second inverter 124b in the temperature control unit 13a as a logical threshold voltage, and a return voltage threshold value Vtb, which is set at a higher voltage level than the detection voltage threshold value Vta, is set to the third inverter 125 as a logical threshold voltage. The detection voltage threshold value Vta indicates an over temperature detection design temperature at which the output element 1 transitions from a normal state to an over temperature state. The detection voltage threshold value Vta is a reference value for over temperature detection, and, when the voltage level of the temperature detection signal is lower than the detection voltage threshold value Vta, the output element 1 is determined to be in the over temperature state. When the output voltage from the temperature sensor is equal to or greater than the detection voltage threshold value Vta, a high logic level (H level) is input to the set terminal SN of the latch circuit 126. When the output voltage from the temperature sensor is less than the detection voltage threshold value Vta, a low logic level (L level) is input to the set terminal SN of the latch circuit 126. The return voltage threshold value Vtb indicates a return detection design temperature at which the output element 1 returns from an over temperature region to a normal region. The return voltage threshold value Vtb is a reference value for return detection, and, when the voltage level of the temperature detection signal is higher than the return voltage threshold value Vtb, the output element 1 is determined to be in the normal state. When the output voltage from the temperature sensor is higher than the return voltage threshold value Vtb, the L level is input to the reset terminal RN of the latch circuit 126. When the output voltage from the temperature sensor is equal to or less than the return voltage threshold value Vtb, the H level is input to the reset terminal RN of the latch circuit 126. Voltage width from the detection voltage threshold value Vta to the return voltage threshold value Vtb serves as hysteresis voltage. The temperature corresponding to the detection voltage threshold value Vta is set at, for example, approximately 175° C. when the temperature sensor has the four stage configuration and 150° C. when the temperature sensor has the three stage configuration. The return voltage threshold value Vtb is set at a temperature approximately 5° C. to approximately 10° C. higher than the temperature corresponding to the detection voltage threshold value Vta. Therefore, the hysteresis voltage becomes approximately 10 mV to approximately 25 mV.

With reference to FIG. 10, operation of the over temperature protection circuit 13 when the output element 1 transitions from the normal region to the over temperature region will be described. When current is applied to the output element 1 and environmental temperature rises, the voltage level of output voltage from the temperature sensor falls associated with the temperature rise. As illustrated in FIG. 10, the voltage level in the normal region is higher than the return voltage threshold value Vtb, and the set terminal SN and reset terminal RN of the latch circuit 126 are at the H level and the L level, respectively. The output level of the output terminal Q becomes the L level, an over temperature detection signal SOT of the L level indicating that the environmental temperature is in the normal region is transmitted to the drive circuit 4 via the filter unit 127, and the current application to the output element 1 is continued. When the environmental temperature continues rising and the output voltage from the temperature sensor becomes equal to or lower than the return voltage threshold value Vtb and reaches a voltage level within the width of the hysteresis voltage, the input level of the reset terminal RN turns to the H level. Since the set terminal SN is kept at the H level, the output terminal Q is maintained at the L level. When the environmental temperature further rises and the output voltage crosses the detection voltage threshold value Vta, the set terminal SN turns to the L level. Since the reset terminal RN is kept at the H level, the output terminal Q turns to the H level. As a result, an over temperature detection signal SOT of the H level indicating that the environmental temperature is in the over temperature region is transmitted to the drive circuit 4 via the filter unit 127, and the current application to the output element 1 is suspended.

Next, with reference to FIG. 11, operation of the over temperature protection circuit 13 when the output element 1 returns from the over temperature region to the normal region will be described. When the current application to the output element 1 is suspended and the environmental temperature falls, the voltage level of the output voltage from the temperature sensor rises associated with the temperature fall. As illustrated in FIG. 11, when the output voltage becomes equal to or higher than the detection voltage threshold value Vta, escapes from the over temperature region, and reaches a voltage level within the width of the hysteresis voltage, the set terminal SN turns to the H level. Since the reset terminal RN is kept at the H level, the output terminal Q is maintained at the H level. Therefore, the over temperature detection signal SOT of the H level is transmitted from the output terminal Q to the drive circuit 4, and the current application to the output element 1 is kept suspended. When the environmental temperature further falls with the output voltage crossing the return voltage threshold value Vtb, the reset terminal RN turns to the L level. Since the set terminal SN is kept at the H level, the output terminal Q turns to the L level. As a result, the over temperature detection signal SOT of the L level indicating that the environmental temperature is in the normal region is transmitted to the drive circuit 4 via the filter unit 127, and the current application to the output element 1 is resumed.

As described above, in the semiconductor device according to the second embodiment, the first temperature sensor 22a, the second temperature sensor 22b, the third temperature sensor 22c, and the fourth temperature sensor 22d are connected in series. Further, the fourth temperature sensor 22d has the anode electrically connecting to the primary lead terminal 9a and the cathode, which electrically connects to the ground wiring 10, electrically connects to the secondary lead terminal 9b. Using the primary lead terminal 9a and the secondary lead terminal 9b kept open-circuited causes the four stage configuration made up of the first temperature sensor 22a, the second temperature sensor 22b, the third temperature sensor 22c, and the fourth temperature sensor 22d to be formed. Short-circuiting the primary lead terminal 9a and the secondary lead terminal 9b to each other causes the three stage configuration made up of the first temperature sensor 22a, the second temperature sensor 22b, and the third temperature sensor 22c to be formed, and the number of stages in the temperature sensor can be changed. Since the number of stages in the temperature sensor can be arbitrarily changed outside the package 40 illustrated in FIG. 4, it is possible to arbitrarily change the reference value for the over temperature detection according to the status of use of the semiconductor device according to the second embodiment. Note that, since, when the temperature sensor is configured into the three stage configuration, the rate of change in the output voltage from the temperature sensor becomes small, variation in the over temperature detection temperature increases. In such a case, it is only necessary to design an over temperature protection circuit taking into account variation in the over temperature detection temperature.

In addition, the number of temperature sensors used in the primary over temperature detection circuit and the secondary over temperature detection circuit for use in the over temperature detection is not limited. One or more temperature sensors may be used as the primary over temperature detection circuit, and a plurality of temperature sensors may be used as the secondary over temperature detection circuit.

Third Embodiment

Figure 12:
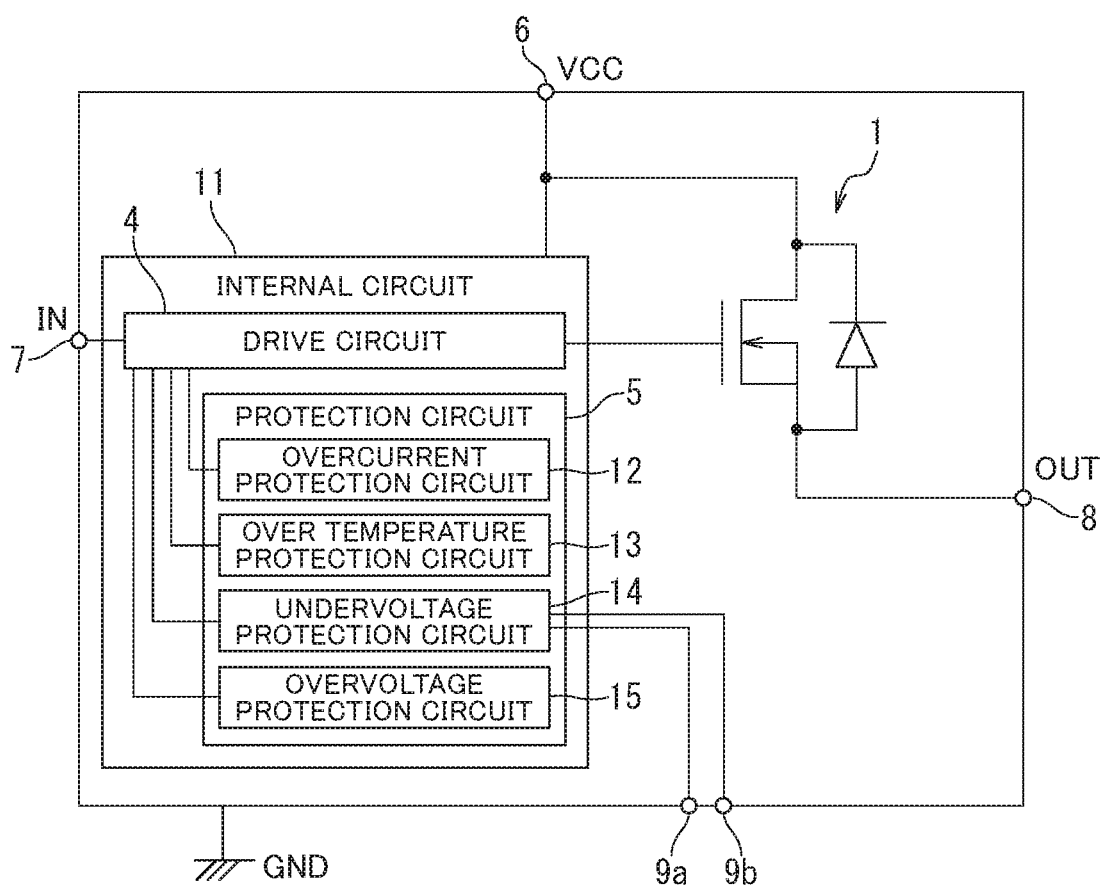
FIG. 12 is a block diagram illustrative of an example of a semiconductor device according to a third embodiment of the present invention.

In a semiconductor device according to a third embodiment of the present invention, as illustrated in FIG. 12, an undervoltage protection circuit 14 in a protection circuit 5 is electrically connected to a primary lead terminal 9a and a secondary lead terminal 9b of a package. Keeping open-circuited or short-circuiting the primary lead terminal 9a and the secondary lead terminal 9b enables a reference value for undervoltage detection in the undervoltage protection circuit 14 to be changed arbitrarily. The semiconductor device according to the third embodiment differs from the first and second embodiments in that the undervoltage protection circuit 14 in the protection circuit 5 is electrically connected to the primary lead terminal 9a and the secondary lead terminal 9b and functions as a "reference value change circuit" that is capable of changing a reference value used in an internal circuit. Since the configuration of the other constituent components is the same as those of the first and second embodiments, a redundant description thereof will be omitted.

Figure 13:
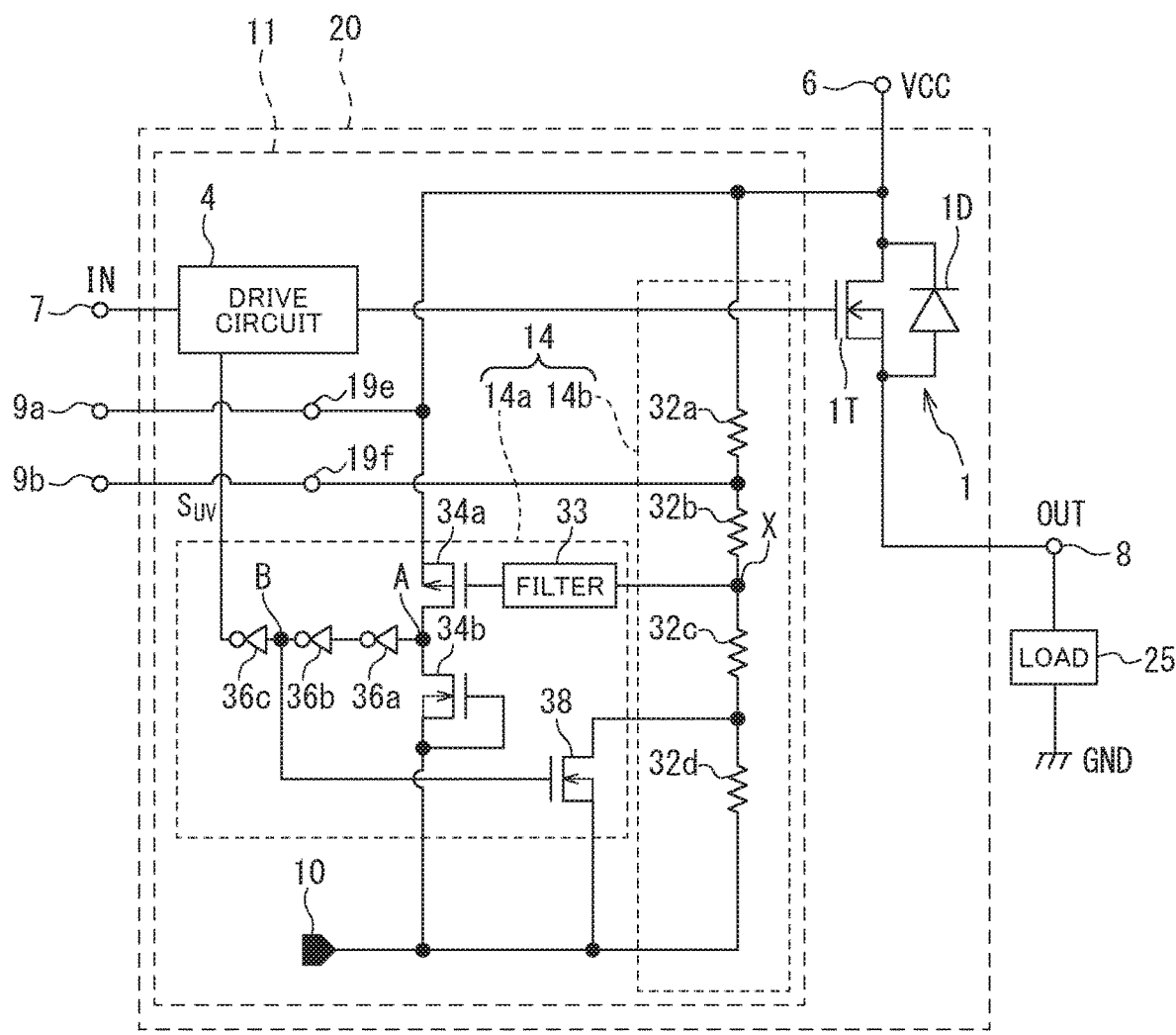
FIG. 13 is a circuit diagram illustrative of an example of the semiconductor device according to the third embodiment of the present invention.

The undervoltage protection circuit 14 includes, as illustrated in FIG. 13, an undervoltage control unit 14a, a sensor circuit 14b, and the like. The undervoltage control unit 14a includes a filter unit 33, a p-type MOS transistor 34a, a depression type MOS transistor 34b, a n-type MOS transistor 38, a first inverter 36a, a second inverter 36b, a third inverter 36c, and the like. The sensor circuit 14b includes a "primary undervoltage detection circuit (primary detection circuit)" constituted by a second resistance element 32b, a third resistance element 32c, and fourth resistance element 32d that are connected in series, a first resistance element 32a as a "secondary undervoltage detection circuit (secondary detection circuit)" connected in series to the primary undervoltage detection circuit, and the like.

The first resistance element 32a of the sensor circuit 14b has one end electrically connected to a lead terminal 6 for power supply to which an external power supply VCC, such as a battery, is supplied and the other end electrically connecting to one end of the second resistance element 32b. The primary lead terminal 9a of the package electrically connects to the one end of the first resistance element 32a via a connection node 19e, and the secondary lead terminal 9b of the package electrically connects to the other end of the first resistance element 32a via a connection node 19f. Open-circuiting the primary lead terminal 9a and the secondary lead terminal 9b causes an undervoltage sensor having a four stage configuration in which the first resistance element 32a, the second resistance element 32b, the third resistance element 32c, and the fourth resistance element 32d are connected in series to be formed. Short-circuiting the primary lead terminal 9a and the secondary lead terminal 9b to each other causes an undervoltage sensor having a three stage configuration in which the second resistance element 32b, the third resistance element 32c, and the fourth resistance element 32d are connected in series to be formed. The sensor circuit 14b detects undervoltage as an "abnormality" of the external power supply. When the voltage of the external power supply falls, there is a possibility that the operation of the internal circuit becomes unstable and an output element 1 malfunctions. Note that the filter unit 33 is an RC-type low-pass filter and removes noises and the like of the external power supply VCC.

One end of the filter unit 33 in the undervoltage control unit 14a, as illustrated in FIG. 13, electrically connects to a connection node X between the second resistance element 32b and the third resistance element 32c in the primary undervoltage detection circuit. The other end of the filter unit 33 electrically connects to the gate electrode of the MOS transistor 34a. The MOS transistor 34a has the source electrode electrically connected to the lead terminal 6 for power supply and the drain electrode electrically connecting to the input of the first inverter 36a via a node A. To the first inverter 36a, the second inverter 36b electrically connects, and the second inverter 36b electrically connects to the third inverter 36c via a node B. The output of the third inverter 36c electrically connects to a drive circuit 4. The MOS transistor 34b has the drain electrode electrically connecting to the drain electrode of the MOS transistor 34a via the node A and the source electrode electrically connecting to a ground wiring 10. Between the drain electrode and source electrode of the MOS transistor 38, the fourth resistance element 32d is connected in parallel, and the source electrode of the MOS transistor 38 electrically connects to the ground wiring 10. The gate electrode of the MOS transistor 38 electrically connects to the node B. The voltage level at the connection node X is, in the four stage configuration, determined by a voltage dividing ratio between the resistance of a series connection of the first resistance element 32a and the second resistance element 32b and the resistance of a series connection of the third resistance element 32c and the fourth resistance element 32d.

By use of the four stage configuration configured by open-circuiting the primary lead terminal 9a and the secondary lead terminal 9b, basic operation of the undervoltage protection circuit 14 will be described. In the third embodiment, a gate threshold voltage of the MOS transistor 34a is used as a reference value for the undervoltage detection. When the voltage of the external power supply VCC, such as a battery, is in a normal state, voltage higher than the gate threshold voltage of the MOS transistor 34a is applied from the connection node X. The MOS transistor 34a is in the ON state, and the node A, which is electrically connected to the drain electrode of the MOS transistor 34a, is at the H level. In addition, the MOS transistor 38, which has the gate electrode electrically connected to the output of the second inverter 36b, is in the ON state, and the fourth resistance element 32d is bypass-connected to a ground potential via the ground wiring 10 by the MOS transistor 38 and is thereby short-circuited. Therefore, the voltage level at the connection node X is determined by a voltage dividing ratio between the resistance of the series connection of the first resistance element 32a and the second resistance element 32b and the resistance of the third resistance element 32c. When the voltage of the external power supply VCC falls and the voltage level at the connection node X falls into an undervoltage state, for example, at a voltage equal to or less than 3 V, the MOS transistor 34a turns off and the node A is electrically connected to the ground wiring 10 via the depression type MOS transistor 34b. Therefore, the voltage level at the node A is pulled down to the ground level. That is, an inverter constituted by the p-type MOS transistor 34a and the depression type MOS transistor 34b turns off, and the node A is fixed to the L level. At this time, the output level of the third inverter 36c becomes the H level, an undervoltage detection signal $S_{UV}$ of the H level indicating that the external power source VCC is in the undervoltage state is transmitted to the drive circuit 4, and current application to the output element 1 is suspended. At the same time, the voltage level of the gate electrode of the MOS transistor 38, which is electrically connected to the node B, becomes the L level, and the MOS transistor 38 turns to the OFF state.

In the undervoltage state, the voltage level of the gate electrode of the MOS transistor 38, which is electrically connected to the node B, becomes the L level, and the MOS transistor 38 turns off. As a result, the voltage level at the connection node X is determined by a voltage dividing ratio between the resistance of the series connection of the first resistance element 32a and the second resistance element 32b and the resistance of the series connection of the third resistance element 32c and the fourth resistance element 32d and becomes lower than that when in the normal state. Therefore, unless the voltage level of the external power supply VCC rises and exceeds the reference value for the undervoltage detection, the external power supply VCC cannot return to the normal state. When the voltage level at the connection node X becomes equal to or greater than a return voltage level, for example, 3.2 V, at which the voltage level becomes equal to or greater than the gate threshold voltage of the MOS transistor 34a, the MOS transistor 34a turns on and the node A is pulled up to the voltage level of the external power supply VCC and becomes the H level. At this time, the output level of the third inverter 36c becomes the L level, an undervoltage detection signal $S_{UV}$ of the L level indicating that the external power source VCC is in the normal state is transmitted to the drive circuit 4, and the current application to the output element 1 is resumed. At the same time, the voltage level of the gate electrode of the MOS transistor 38, which is electrically connected to the node B, becomes the H level, and the MOS transistor 38 turns to the ON state. As described above, turning on and off the MOS transistor 38 enables the voltage dividing ratio at the connection node X to be switched and hysteresis voltage to be generated.

In the case of the three stage configuration configured by short-circuiting the primary lead terminal 9a and the secondary lead terminal 9b to each other, the voltage level at the connection node X is determined by a voltage dividing ratio between the resistance of the second resistance element 32b and the resistance of the series connection of the third resistance element 32c and the fourth resistance element 32d. Therefore, the voltage dividing ratio at the connection node X becomes smaller in the case of the three stage configuration than in the case of the four stage configuration, and it is thus possible to raise the reference value for the undervoltage detection.

The number of resistance elements used in the primary undervoltage detection circuit and the secondary undervoltage detection circuit for use in the undervoltage detection is not limited. Four or more resistance elements may be used as the primary undervoltage detection circuit, and a plurality of resistance elements may be used as the secondary undervoltage detection circuit.

Figure 14:
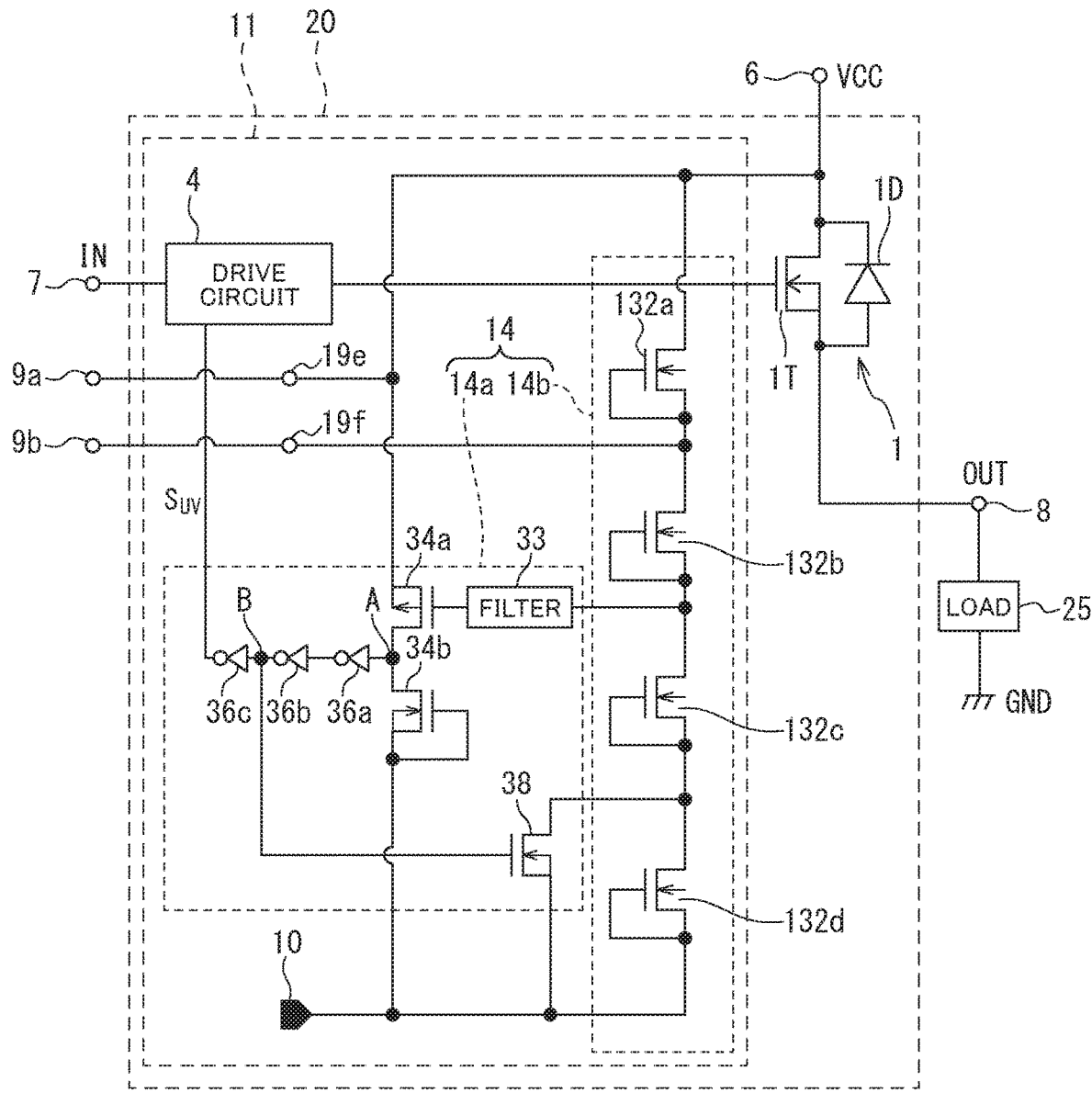
FIG. 14 is a circuit diagram illustrative of another example of the semiconductor device according to the third embodiment of the present invention.

Note that, although, in the above description, resistance elements are used in the undervoltage detection, elements to be used are not limited to resistance elements. For example, as illustrated in FIG. 14, depression type MOS transistors 132a to 132d may be used as the undervoltage detection elements. The MOS transistor 132a of the sensor circuit 14b has one end electrically connected to the lead terminal 6 for power supply to which the external power supply VCC, such as a battery, is supplied and the other end electrically connecting to one end of the MOS transistor 132b. The primary lead terminal 9a electrically connects to the one end of the MOS transistor 132a via the connection node 19e, and the secondary lead terminal 9b electrically connects to the other end of the MOS transistor 132a via the connection node 19f. Open-circuiting the primary lead terminal 9a and the secondary lead terminal 9b causes an undervoltage sensor having a four stage configuration in which the MOS transistors 132a to 132d are connected in series to be formed. Short-circuiting the primary lead terminal 9a and the secondary lead terminal 9b to each other causes an undervoltage sensor having a three stage configuration in which the MOS transistors 132b to 132d are connected in series to be formed.

Since the primary lead terminal 9a serves as a terminal to which the external power supply VCC is supplied, the lead terminal 6 for power supply may be configured to be used as the primary lead terminal without disposing the primary lead terminal 9a, a pad 29a, and the like. As described above, in the third embodiment, keeping open-circuited or short-circuiting the primary lead terminal 9a or the lead terminal 6 for power supply and the secondary lead terminal 9b enables the reference value for the undervoltage detection in the undervoltage protection circuit 14 to be changed arbitrarily. Since, as described above, the number of stages of the undervoltage sensor can be arbitrarily changed outside the package 40 illustrated in FIG. 4, it becomes possible to arbitrarily change the reference value for the undervoltage detection according to the status of use of the semiconductor device according to the third embodiment.

Fourth Embodiment

Figure 15:
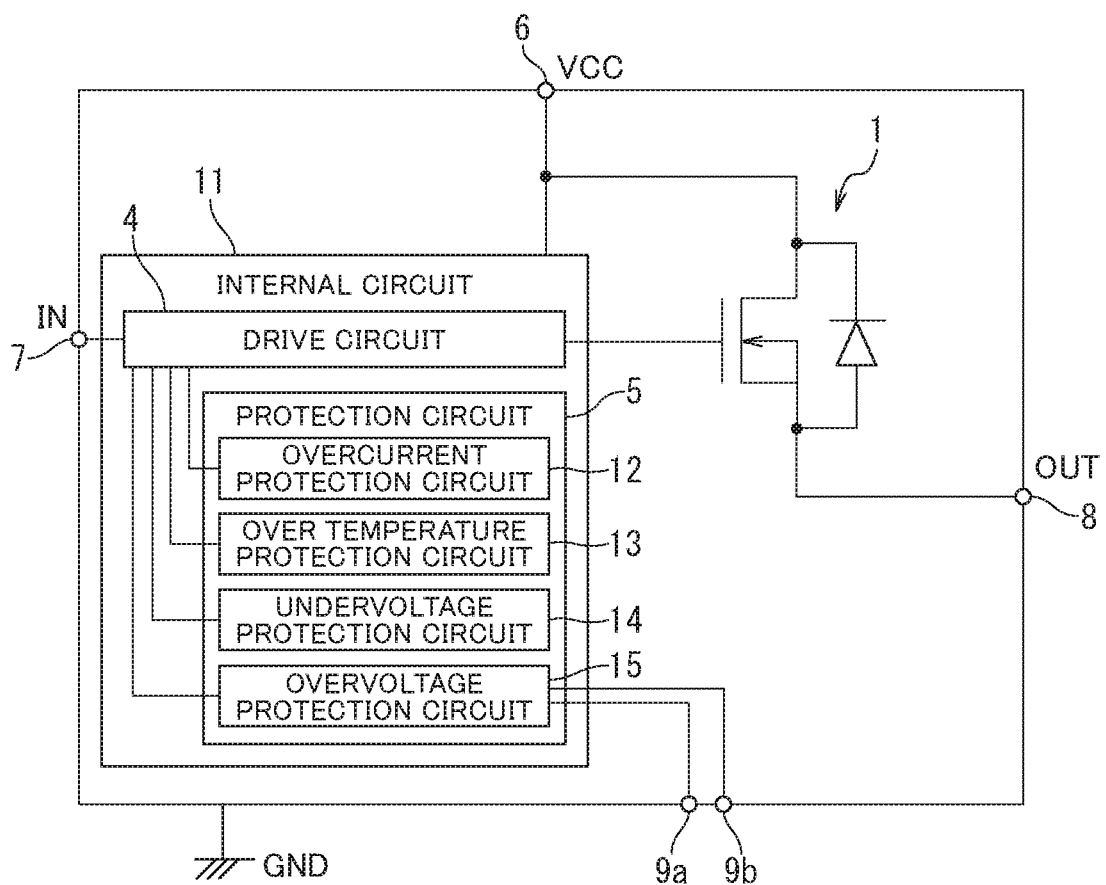
FIG. 15 is a block diagram illustrative of an example of a semiconductor device according to a fourth embodiment of the present invention.

In a semiconductor device according to a fourth embodiment of the present invention, as illustrated in FIG. 15, an overvoltage protection circuit 15 in a protection circuit 5 is electrically connected to a primary lead terminal 9a and a secondary lead terminal 9b of a package. Keeping open-circuited or short-circuiting the primary lead terminal 9a and the secondary lead terminal 9b enables a reference value for overvoltage detection in the overvoltage protection circuit 15 to be changed arbitrarily. The semiconductor device according to the fourth embodiment differs from the first to third embodiments in that the overvoltage protection circuit 15 in the protection circuit 5 is electrically connected to the primary lead terminal 9a and the secondary lead terminal 9b and functions as a "reference value change circuit" that is capable of changing a reference value used in an internal circuit. Since the configuration of the other constituent components is the same as those of the first to third embodiments, a redundant description thereof will be omitted.

Figure 16:
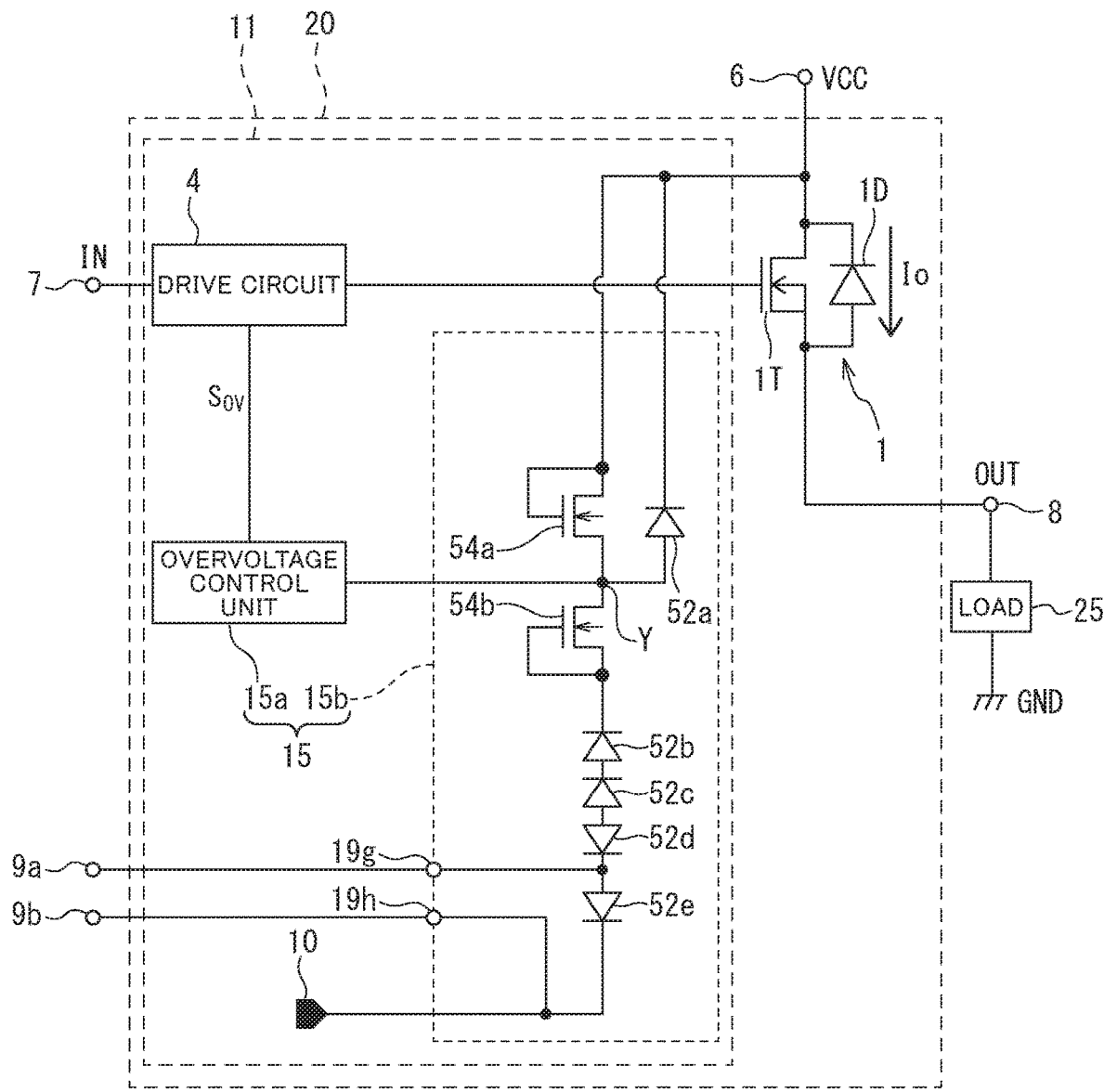
FIG. 16 is a circuit diagram illustrative of an example of the semiconductor device according to the fourth embodiment of the present invention.

The overvoltage protection circuit 15 includes, as illustrated in FIG. 16, an overvoltage control unit 15a, a sensor circuit 15b, and the like. The sensor circuit 15b includes a first sense element 54a and a second sense element 54b, which are depression type MOS transistors, a plurality of detection elements made up of a first detection element 52a, a second sense element 52b, a third detection element 52c, a fourth detection element 52d, and a fifth detection element 52e, which are diffusion diodes, and the like. The first detection element 52a, the second detection element 52b, the third detection element 52c, and the fourth detection element 52d constitute a "primary overvoltage detection circuit (primary detection circuit)", and the fifth detection element 52e constitutes a "secondary overvoltage detection circuit (secondary detection circuit)". The sensor circuit 15b detects overvoltage as an "abnormality" of an external power supply. There is a concern that, when external power supply voltage rises while an output element 1 is in the ON state, burning damage to a load may be caused to occur. Therefore, when the external power supply voltage rises to a predetermined voltage, the output element 1 is turned to the OFF state and the load is thereby protected.

The cathode of the first detection element 52a and the drain of the first sense element 54a in the sensor circuit 15b are electrically connected to a lead terminal 6 for power supply to which an external power supply VCC, such as a battery, is supplied. The anode of the first detection element 52a and the source of the first sense element 54a electrically connect to a connection node Y. To the connection node Y, the overvoltage control unit 15a and the source of the second sense element 54b electrically connect. The second detection element 52b has the cathode electrically connecting to the drain of the second sense element 54b and the anode electrically connecting to the cathode of the third detection element 52c. The anode of the third detection element 52c electrically connects to the anode of the fourth detection element 52d. The cathode of the fourth detection element 52d electrically connects to the anode of the fifth detection element 52e. The cathode of the fifth detection element 52e electrically connects to a ground wiring 10. The primary lead terminal 9a electrically connects to the anode of the fifth detection element 52e via a connection node 19g, and the secondary lead terminal 9b electrically connects to the cathode of the fifth detection element 52e via a connection node 19h. Open-circuiting the primary lead terminal 9a and the secondary lead terminal 9b causes an overvoltage sensor having a five stage configuration in which the first detection element 52a, the second detection element 52b, the third detection element 52c, the fourth detection element 52d, and the fifth detection element 52e are connected in series to be formed. Short-circuiting the primary lead terminal 9a and the secondary lead terminal 9b to each other causes an overvoltage sensor having a four stage configuration in which the first detection element 52a, the second detection element 52b, the third detection element 52c, and the fourth detection element 52d are connected in series to be formed.

Figure 17:
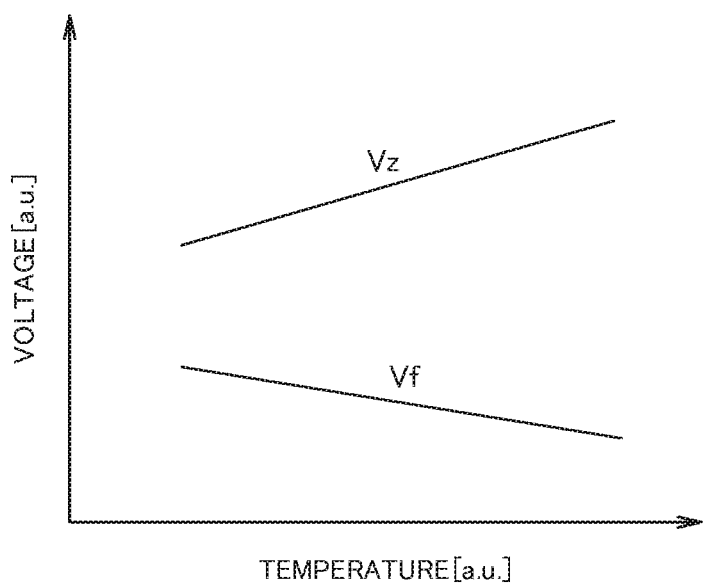
FIG. 17 is a diagram illustrative of an example of temperature characteristics of an overvoltage detection element used for an overvoltage protection circuit according to the fourth embodiment of the present invention.

As the first detection element 52a, the second detection element 52b, and the third detection element 52c, constant voltage diodes, such as Zener diodes and avalanche diodes, are used. The first detection element 52a, the second detection element 52b, and the third detection element 52c have reverse breakdown voltages Vz and are used connected in the reverse direction. As the fourth detection element 52d and the fifth detection element 52e, Si diodes using polysilicon or the like are used. The fourth detection element 52d and the fifth detection element 52e have forward voltages Vf and are used connected in the forward direction. As illustrated in FIG. 17, each constant voltage diode has a reverse breakdown voltage Vz of equal to or greater than 5 V and has a positive temperature coefficient. Each Si diode has a forward voltage Vf of approximately 0.6 V to 0.7 V and has a negative temperature coefficient. A composite voltage obtained by using the first detection element 52a, the second detection element 52b, and the third detection element 52c, each of which has a reverse breakdown voltage Vz of, for example, approximately 6 V, connected in the reverse direction is set as a primary reference value for the overvoltage detection, and, to compensate for temperature characteristics, the fourth detection element 52d and the fifth detection element 52e are used connected in the forward direction.

In the overvoltage control unit 15a, the voltage level at the connection node Y when the voltage level is at the voltage level of the external power supply VCC is defined as the H level indicating that the external power supply VCC is in a normal state, and the ground level of the ground wiring 10 is defined as the L level indicating that the external power supply VCC is in an overvoltage state. When the voltage of the external power supply VCC rises and voltage across the first detection element 52a, voltage across the second detection element 52b, and voltage across the third detection element 52c respectively reach the reverse breakdown voltage Vz, the voltage level at the connection node Y falls from the voltage level of the external power supply VCC to the ground level of the ground wiring 10. When the voltage level at the connection node Y turns from the H level to the L level, the overvoltage control unit 15a transmits an overvoltage detection signal Soy of the L level to a drive circuit 4 and current application to the output element 1 is suspended. When the voltage of the external power supply VCC returns to a normal voltage and the voltage across the first detection element 52a, the voltage across the second detection element 52b, and the voltage across the third detection element 52c respectively become lower than the reverse breakdown voltage Vz, the voltage level at the connection node Y is reversed from the L level to the H level. Therefore, an overvoltage detection signal Soy of the H level is transmitted to the drive circuit 4, and the current application to the output element 1 is resumed. Note that, in the present embodiment, when the ground wiring 10 is, instead of an internal ground wiring, a wiring that is grounded, a ground terminal 30 can be used as a secondary lead terminal without disposing the secondary lead terminal 9b, a pad 29b, and the like.

In the semiconductor device according to the fourth embodiment, when the primary lead terminal 9a and the secondary lead terminal 9b or the ground terminal 30 are open-circuited, the reference value for the overvoltage detection using the five stage configuration becomes approximately 19.2 V to 19.4 V. When the primary lead terminal 9a and the secondary lead terminal 9b are short-circuited to each other, the reference value for the overvoltage detection using the four stage configuration becomes approximately 18.6 V to 18.7 V. Since, as described above, the number of stages in the overvoltage sensor can be arbitrarily changed outside the package 40 illustrated in FIG. 4, it is possible to arbitrarily change the reference value for the overvoltage detection according to the status of use of the semiconductor device according to the fourth embodiment.

Fifth Embodiment

In the semiconductor devices according to the above-described first to fourth embodiments, the protection circuit 5 in which four reference value change circuits, namely the overcurrent protection circuit 12, the over temperature protection circuit 13, the undervoltage protection circuit 14, and the overvoltage protection circuit 15, exist was exemplified. In each of the semiconductor devices according to the first to fourth embodiments, by electrically connecting the primary lead terminal 9a and the secondary lead terminal 9b to one of the reference value change circuits in the protection circuit 5 in which a protection reference value is required to be changed, the protection reference value was changed. Once the protection circuit 5 including a plurality of reference value change circuits, including the overcurrent protection circuit 12, the over temperature protection circuit 13, the undervoltage protection circuit 14, and the overvoltage protection circuit 15, is produced, it is impossible to electrically connect the primary lead terminal 9a and the secondary lead terminal 9b to another reference value change circuit in the protection circuit 5. Therefore, it is required to prepare the same number of types of semiconductor devices as the number of protection circuits, such as the overcurrent protection circuit 12, the over temperature protection circuit 13, the undervoltage protection circuit 14, and the overvoltage protection circuit 15, in which change of a protection reference value may be required. It is possible to produce a semiconductor device by using fuses made of polysilicon or the like and applying fuse trimming technology in such a way as to be able to electrically connect any of the overcurrent protection circuit 12, the over temperature protection circuit 13, the undervoltage protection circuit 14, the overvoltage protection circuit 15, and the like in which change of a protection reference value is required to the primary lead terminal 9a and the secondary lead terminal 9b.

Figure 18:
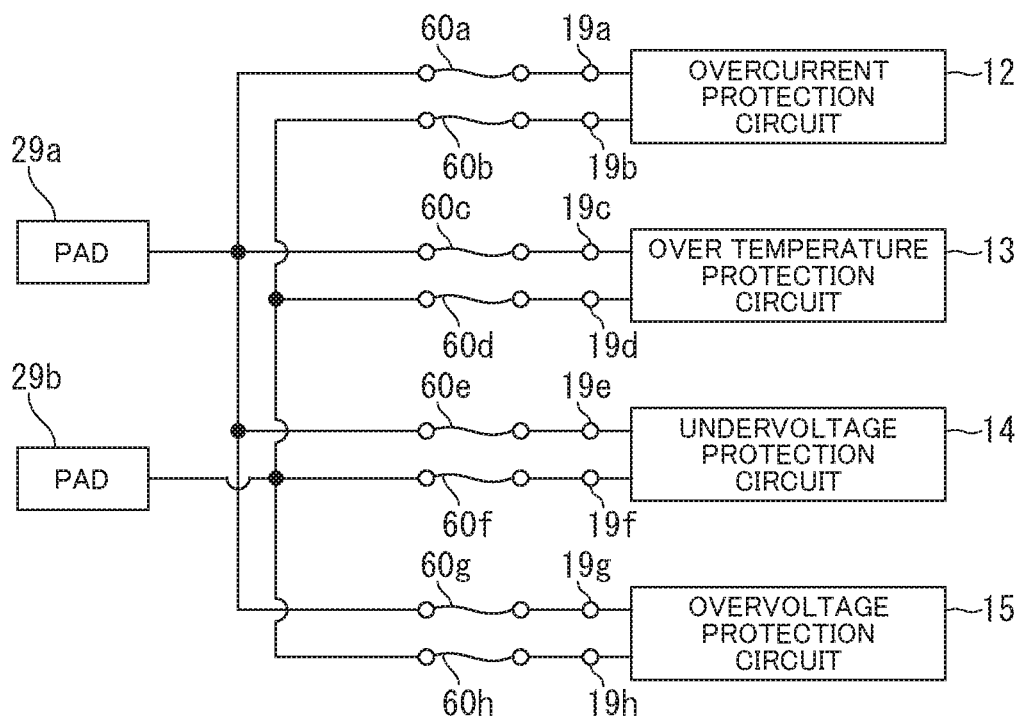
FIG. 18 is a block diagram illustrative of an example of a semiconductor device according to a fifth embodiment of the present invention.

In the semiconductor device according to the fifth embodiment of the present invention, as illustrated in FIG. 18, a case where a first connection node 19a and a second connection node 19b of the overcurrent protection circuit 12 electrically connect to a first detection element pad 29a and a second detection element pad 29b via a first fuse 60a and a second fuse 60b, respectively, is exemplified. A third connection node 19c and a fourth connection node 19d of the over temperature protection circuit 13 electrically connect to the first detection element pad 29a and the second detection element pad 29b via a third fuse 60c and a fourth fuse 60d, respectively. A fifth connection node 19e and a sixth connection node 19f of the undervoltage protection circuit 14 electrically connect to the first detection element pad 29a and the second detection element pad 29b via a fifth fuse 60e and a sixth fuse 60f, respectively. A seventh connection node 19g and an eighth connection node 19h of the overvoltage protection circuit 15 electrically connect to the first detection element pad 29a and the second detection element pad 29b via a seventh fuse 60g and an eighth fuse 60h, respectively.

For example, flowing current through and thereby fusing all the fuses except the first fuse 60a and the second fuse 60b connected to the overcurrent protection circuit 12 enables only the overcurrent protection circuit 12 to be electrically connected to the first detection element pad 29a and the second detection element pad 29b. As described above, using the fuse trimming technology enables a reference value change circuit in which change of a protection reference value is required to be arbitrarily selected after the semiconductor device has been produced. Note that, even after fuses have been fused, any of the protection circuits is capable of functioning as a reference value change circuit having a fixed reference value. In addition, although the fuses are disposed in such a way as to electrically connect to both the first detection element pad 29a and the second detection element pad 29b, the fuses may be disposed in such a way as to electrically connect to only either of the first detection element pad 29a and the second detection element pad 29b.

First Variation of Fifth Embodiment

Figure 19:
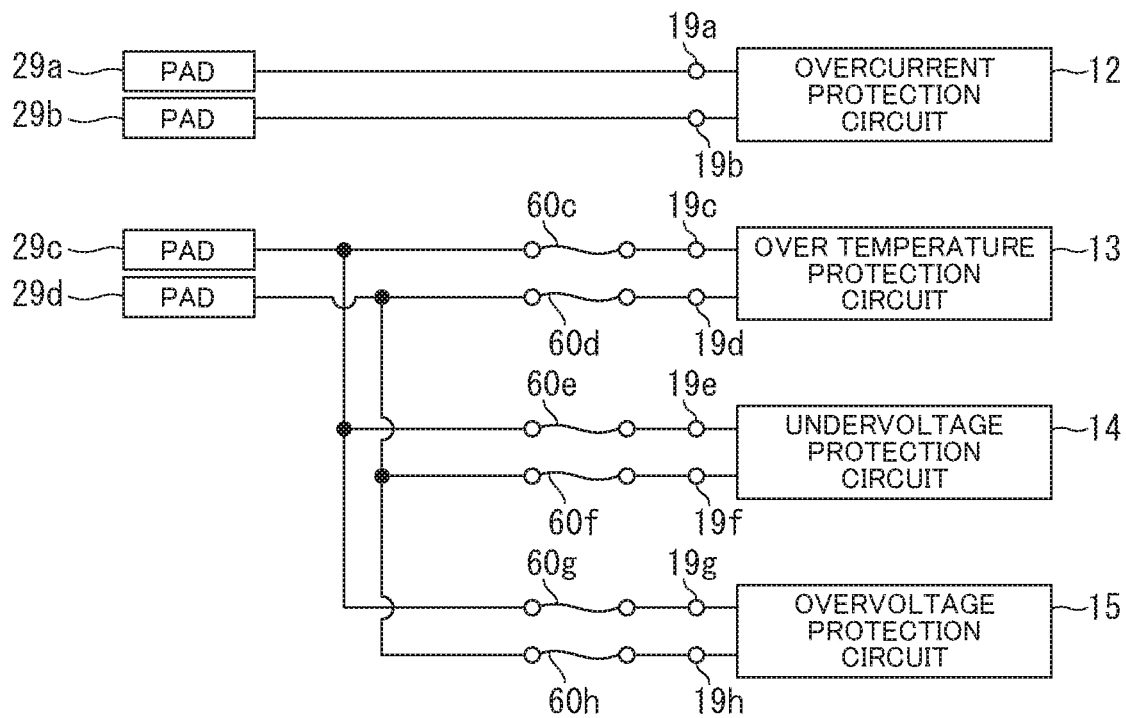
FIG. 19 is a block diagram illustrative of an example of a semiconductor device according to a first variation of the fifth embodiment of the present invention.

Although, in the semiconductor devices according to the first to fourth embodiments, a pair of the first detection element pad 29a and the second detection element pad 29b are disposed, a plurality of pairs of detection element pads may be disposed when the chip surface area of the semiconductor device can be increased. When two pairs of detection element pads are disposed, the overcurrent protection circuit 12 electrically connects to the first detection element pad 29a and the second detection element pad 29b without using the first fuse 60a and the second fuse 60b illustrated in FIG. 18 as in, for example, the semiconductor device according to a first variation of the fifth embodiment illustrated in FIG. 19. On the other hand, the over temperature protection circuit 13 electrically connects to a third detection element pad 29c and a fourth detection element pad 29d by use of the third fuse 60c and the fourth fuse 60d that are similar to those in FIG. 18, respectively. Similarly, the undervoltage protection circuit 14, by use of the fifth fuse 60e and the sixth fuse 60f, and the overvoltage protection circuit 15, by use of the seventh fuse 60g and the eighth fuse 60h, electrically connect to the third detection element pad 29c and the fourth detection element pad 29d, respectively. A reference value change circuit among the over temperature protection circuit 13, the undervoltage protection circuit 14, and the overvoltage protection circuit 15 is left electrically connected to the third detection element pad 29c and the fourth detection element pad 29d, and the fuses of the other two reference value change circuits are fused. In this manner, it becomes possible to change reference values of two reference value change circuits.

Second Variation of Fifth Embodiment

Figure 20:
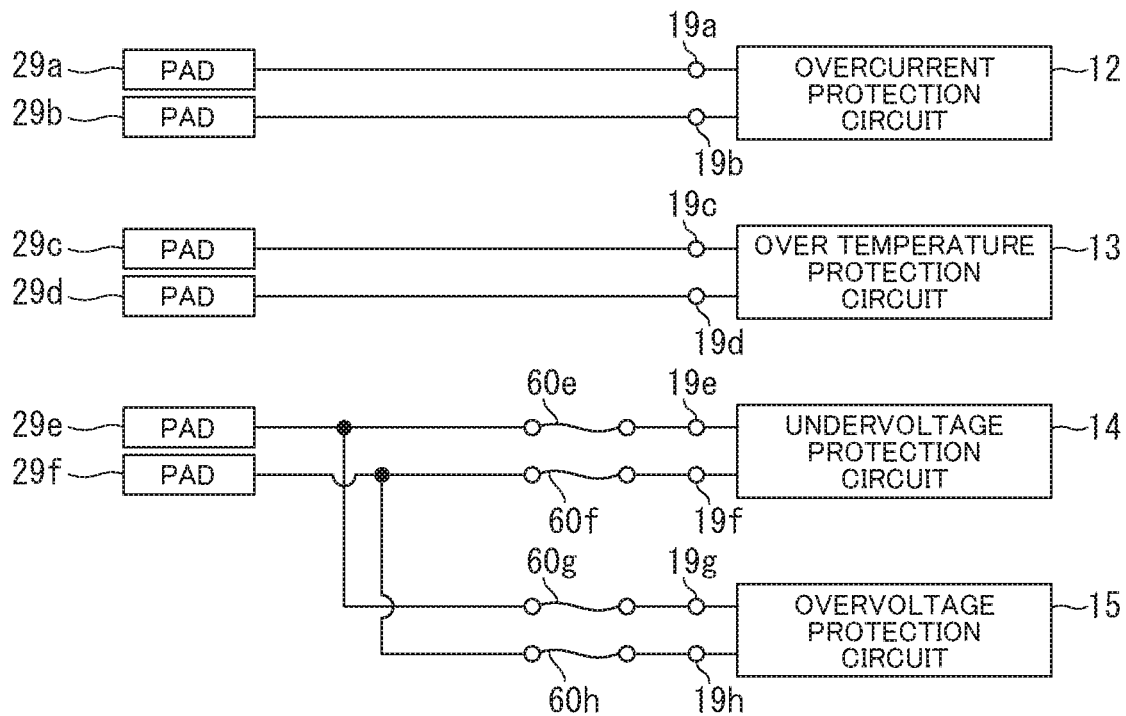
FIG. 20 is a block diagram illustrative of an example of a semiconductor device according to a second variation of the fifth embodiment of the present invention.

When three pairs of detection element pads are disposed, in a semiconductor device according to a second variation of the fifth embodiment illustrated in FIG. 20, for example, the overcurrent protection circuit 12 and the over temperature protection circuit 13 do not use the first fuse 60*a*, the second fuse 60*b*, the third fuse 60*c*, and the fourth fuse 60*d* illustrated in FIG. 18. The overcurrent protection circuit 12 and the over temperature protection circuit 13 of the semiconductor device according to the second variation of the fifth embodiment electrically connect to a pair of the first detection element pad 29*a* and the second detection element pad 29*b* and a pair of the third detection element pad 29*c* and the fourth detection element pad 29*d*, respectively, without using fuses. The undervoltage protection circuit 14, by use of the fifth fuse 60*e* and the sixth fuse 60*f*, and the overvoltage protection circuit 15, by use of the seventh fuse 60*g* and the eighth fuse 60*h*, electrically connect to a fifth detection element pad 29*e* and a sixth detection element pad 29*f*, respectively. Either of the undervoltage protection circuit 14 and the overvoltage protection circuit 15 is left electrically connected to the fifth detection element pad 29*e* and the sixth detection element pad 29*f*, and the fuses of the other reference value change circuits are fused. In this manner, it becomes possible to change reference values of three reference value change circuits.

Third Variation of Fifth Embodiment

Figure 21:
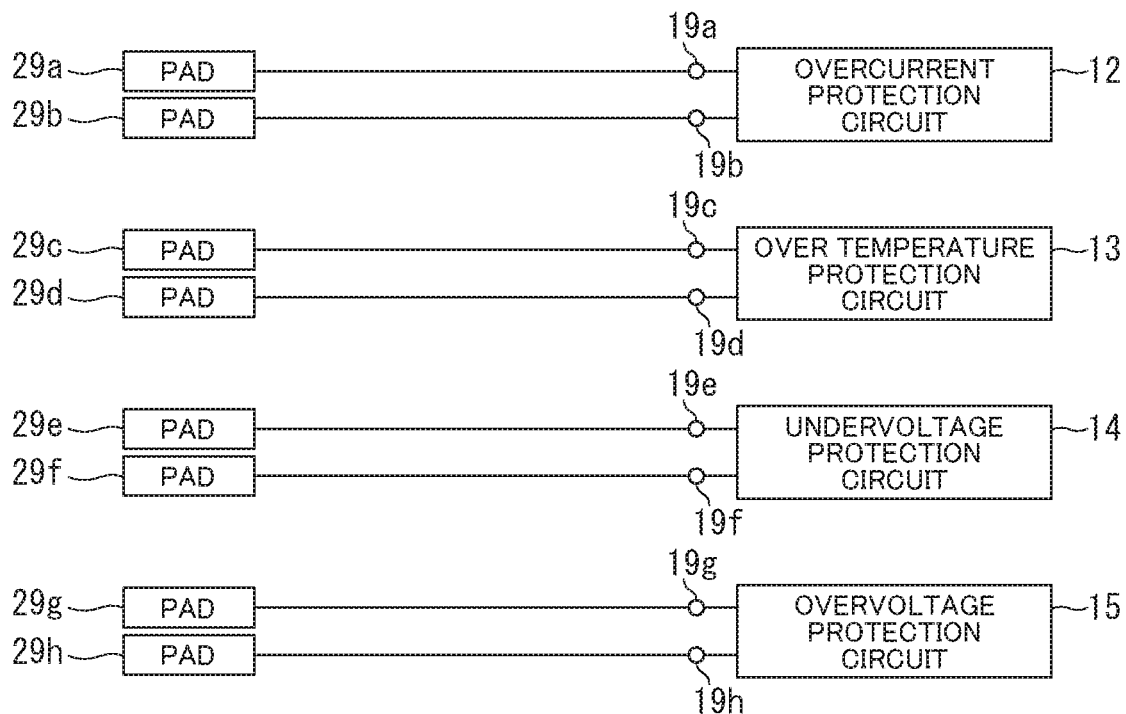
FIG. 21 is a block diagram illustrative of an example of a semiconductor device according to a third variation of the fifth embodiment of the present invention.

Further, as in a semiconductor device according to a third variation of the fifth embodiment illustrated in FIG. 21, pairs of detection element pads each pair of which electrically connects to one of a plurality of reference value change circuits may be disposed. To the overcurrent protection circuit 12, the first detection element pad 29*a* and the second detection element pad 29*b* are electrically connected. To the over temperature protection circuit 13, the third detection element pad 29*c* and the fourth detection element pad 29*d* are electrically connected. To the undervoltage protection circuit 14, the fifth detection element pad 29*e* and the sixth detection element pad 29*f* are electrically connected. To the overvoltage protection circuit 15, a seventh detection element pad 29*g* and an eighth detection element pad 29*h* are electrically connected.

Other Embodiments

Although, as described above, the semiconductor devices according to the first to fifth embodiments were described, it should not be understood that descriptions, such as embodiments, and drawings constituting a part of the description limit the present invention. From the disclosure of the description and drawings of the present invention, various alternative embodiments, examples, and operational technologies will become apparent to those skilled in the art.

As described above, when the spirit of the disclosure of the above-described embodiments is understood, it will become apparent to those skilled in the art that various alternative embodiments, examples, and operational technologies may be included in the present invention. In addition, it goes without saying that the present invention includes various embodiments that are not described herein, such as a constitution to which respective constitutions described in the above-described embodiments and respective variations are arbitrarily applied. Therefore, the technical scope of the present invention is determined only by the invention-specifying matters according to the scope of claims reasonable from the above exemplifying description.

REFERENCE SIGNS LIST

1 Output element
1T Output transistor
1D Internal diode
2 Sense element
2T Sense transistor
2D Internal diode
3*a* Primary overcurrent detection element
3*b* Secondary overcurrent detection element
3*c* Overcurrent detection element
4 Drive circuit
5 Protection circuit
6 Lead terminal for power supply
7 Lead terminal for input
8 Lead terminal for output
9*a* Primary lead terminal
9*b* Secondary lead terminal
10 Ground wiring or internal ground wiring
10*p* Ground wiring pad
11 Internal circuit
12 Overcurrent protection circuit
12*a* Overcurrent control unit
12*b* Sensor circuit
13 Over temperature protection circuit
13*a* Temperature control unit
13*b* Sensor circuit
14 Undervoltage protection circuit
14*a* Undervoltage control unit
14*b* Sensor circuit
15 Overvoltage protection circuit
15*a* Overvoltage control unit
15*b* Sensor circuit
19*a*, 19*b*, 19*c*, 19*d*, 19*e*, 19*f*, 19*g*, 19*h* Connection node
20 Semiconductor chip
21 Front surface electrode pad
22*a*, 22*b*, 22*c* Primary over temperature detection circuit (temperature sensor)
22*d* Secondary over temperature detection element (temperature sensor)
23 Constant current element
25 Load
27 Input pad
29*a*, 29*b*, 29*c*, 29*d*, 29*e*, 29*f*, 29*g*, 29*h* Detection element pad
30 Ground terminal
32*a*, 32*b*, 32*c* Primary undervoltage detection circuit (resistance element)
32*d* Secondary undervoltage detection circuit (resistance element)
37 Wiring member
40 Package
52*a*, 52*b*, 52*c* Constant voltage element
52*d*, 52*e* Detection element
60*a*, 60*b*, 60*c*, 60*d*, 60*e*, 60*f*, 60*g*, 60*h* Fuse

The invention claimed is:

1. A semiconductor device comprising:
an output element including a power supply side electrode region electrically connected to a power supply side main electrode and an output side electrode region electrically connected to an output side main electrode and configured to flow main current between the power supply side electrode region and the output side electrode region;
an internal circuit including a sensor circuit configured to detect an abnormality; and
a package in which the output element and the internal circuit are built, the package including a primary lead terminal and a secondary lead terminal, wherein
the primary lead terminal electrically draws out an intermediate node in wiring of a primary detection circuit constituting the sensor circuit to an outside, the secondary lead terminal electrically draws out a terminal of a secondary detection circuit separable from the primary detection circuit to the outside and can be electrically connected to the primary lead terminal on the outside, and by changing circuit connection of the sensor circuit based on a connection state between the primary lead terminal and the secondary lead terminal, at least a portion of the internal circuit functions as a reference value change circuit changing a reference value for detecting the abnormality.

2. The semiconductor device according to claim 1, wherein
a pad disposed on an upper surface of a semiconductor chip into which the output element and the internal circuit are integrated and electrically connected to the intermediate node of the primary detection circuit is electrically connected to the primary lead terminal, and
a pad disposed on the upper surface of the semiconductor chip and electrically connected to the terminal of the secondary detection circuit is electrically connected to the secondary lead terminal.

3. The semiconductor device according to claim 1, wherein
the internal circuit further includes a drive circuit electrically connected to a control electrode of the output element.

4. The semiconductor device according to claim 1, wherein
the sensor circuit includes:
a sense element including one main electrode region electrically connected to the power supply side electrode region of the output element;
a primary overcurrent detection element including an anode connected to an other main electrode region of the sense element; and
a secondary overcurrent detection element including a cathode that is common to the primary overcurrent detection element and the secondary current detection element,
the internal circuit further includes an overcurrent control unit having two input terminals respectively electrically connected to the output side electrode region and the anode of the primary overcurrent detection element and detect overcurrent as the abnormality, and
the anode of the primary overcurrent detection element is electrically connected to the primary lead terminal, and an anode of the secondary overcurrent detection element is electrically connected to the secondary lead terminal.

5. The semiconductor device according to claim 4, wherein
the sensor circuit sets, as a reference value, a current value flowing into the primary overcurrent detection element when the primary lead terminal and the secondary lead terminal are open-circuited and a sum of current values respectively flowing into the primary overcurrent detection element and the secondary overcurrent detection element when the primary lead terminal and the secondary lead terminal are short-circuited to each other on the outside, and the overcurrent control unit, by comparing output current flowing from the output side electrode region to an external load with the reference value, performs control in such a way as to recover from overcurrent.

6. The semiconductor device according to claim 1, wherein the internal circuit further includes a temperature control unit configured to detect over temperature as the abnormality,
the sensor circuit includes:
a constant current element including an anode electrically connected to the power supply side electrode region;
a primary over temperature detection circuit including an anode electrically connected to a cathode of the constant current element; and
a secondary over temperature detection element including an anode electrically connected to a cathode of the primary over temperature detection circuit,
the temperature control unit is electrically connected to the anode of the primary over temperature detection circuit, and
a connection node between the primary over temperature detection circuit and the secondary over temperature detection element is electrically connected to the primary lead terminal, and the cathode of the secondary over temperature detection element is electrically connected to the secondary lead terminal.

7. The semiconductor device according to claim 6, wherein
the temperature control unit, by comparing, with a reference value, a measured value of forward voltage across a series connection of the primary over temperature detection element and the secondary over temperature detection element, the measured value being measured while constant current is flowed from the constant current element, when the primary lead terminal and the secondary lead terminal are open-circuited and a measured value of forward voltage across the primary over temperature detection element, the measured value being measured while constant current is flowed from the constant current element, when the primary lead terminal and the secondary lead terminal are short-circuited to each other on the outside, performs control in such a way as to recover from the over temperature.

8. The semiconductor device according to claim 1, wherein
the sensor circuit includes a first resistance element one end of which is electrically connected to the power supply side electrode region, a second resistance element connected in series to the first resistance element, a third resistance element connected in series to the second resistance element, and a fourth resistance element connected in series to the third resistance element,
the internal circuit further includes an undervoltage control unit electrically connected to a connection node between the second resistance element and the third resistance element and configured to detect undervoltage as the abnormality,
the primary lead terminal is electrically connected to the power supply side electrode region, and
the secondary lead terminal is electrically connected to a connection node between the first resistance element and the second resistance element.

9. The semiconductor device according to claim 8, wherein
the undervoltage control unit, by comparing, with a preset reference value for undervoltage detection, a voltage value determined by a voltage dividing ratio between a resistance value of a series connection of the first resistance element and the second resistance element and a resistance value of a series connection of the third resistance element and the fourth resistance element when the primary lead terminal and the secondary lead terminal are open-circuited and a voltage value determined by a voltage dividing ratio between a resistance value of the second resistance element and a resistance value of a series connection of the third resistance element and the fourth resistance element when the primary lead terminal and the secondary lead terminal are short-circuited to each other on the outside, performs control in such a way as to recover from the undervoltage.

10. The semiconductor device according to claim 8, further comprising
a lead terminal for power supply electrically connected to the power supply side main electrode, wherein
the primary lead terminal is the lead terminal for power supply.

11. The semiconductor device according to claim 1, wherein
the sensor circuit includes:
a first sense element including one terminal electrically connected to the power supply side electrode region;
a second sense element including one terminal electrically connected to an other terminal of the first sense element;
a first detection element including a cathode electrically connected to the power supply side electrode region and an anode electrically connected to the other terminal of the first sense element;
a second detection element including a cathode electrically connected to an other terminal of the second sense element;
a third detection element including a cathode electrically connected to an anode of the second detection element;
a fourth detection element including an anode electrically connected to an anode of the third detection element; and
a fifth detection element including an anode electrically connected to a cathode of the fourth detection element,
the internal circuit further includes an overvoltage control unit electrically connected to a connection node between the first sense element and the second sense element and configured to detect overvoltage as the abnormality, and
a connection node between the fourth detection element and the fifth detection element is electrically connected to the primary lead terminal, and a cathode of the fifth detection element is electrically connected to the secondary lead terminal.

12. The semiconductor device according to claim 11, wherein
when the primary lead terminal and the secondary lead terminal are open-circuited, the overvoltage control unit sets, as a reference value for overvoltage detection, a voltage value being a sum of reverse breakdown voltage across the second detection element and the third detection element and forward voltage across the fourth detection element and the fifth detection element, and
when the primary lead terminal and the secondary lead terminal are short-circuited to each other on the outside, the overvoltage control unit sets, as the reference value, a voltage value being a sum of reverse breakdown voltage across the first detection element and the second detection element and forward voltage across the fourth detection element, and
the overvoltage control unit performs control in such a way as to recover from the overvoltage.

13. The semiconductor device according to claim 11, further comprising
a ground terminal electrically connected to the internal circuit, wherein
the secondary lead terminal is the ground terminal.

14. The semiconductor device according to claim 1, wherein,
the internal circuit further includes another reference value change circuit including another sensor circuit configured to detect another abnormality in a physical parameter different from the abnormality, and
the semiconductor device further comprising:
another primary lead terminal electrically drawing out an intermediate node in wiring of a second primary detection circuit constituting the another sensor circuit to an outside; and
another secondary lead terminal electrically drawing out a terminal of a second secondary detection circuit separable from the second primary detection circuit of the another sensor circuit to an outside.

15. The semiconductor device according to claim 1, wherein,
the internal circuit further including another reference value change circuit including another sensor circuit configured to detect another abnormality in a physical parameter different from the abnormality, and
the semiconductor device further comprising:
a first fuse electrically connecting an intermediate node in wiring of a primary detection circuit constituting the sensor circuit to the primary lead terminal;
a second fuse electrically connecting a terminal of the secondary detection circuit of the sensor circuit to the secondary lead terminal;
a third fuse electrically connecting an intermediate node in wiring of a second primary detection circuit constituting the another sensor circuit to the primary lead terminal; and
a fourth fuse electrically connecting a terminal of a second secondary detection circuit separable from the second primary detection circuit of the another sensor circuit to the secondary lead terminal.

16. The semiconductor device according to claim 1, wherein,
the internal circuit further includes another reference value change circuit including another sensor circuit configured to detect another abnormality in a physical parameter different from the abnormality, and
the semiconductor device further comprising:
another primary lead terminal electrically draws out an intermediate node in wiring of a second primary detection circuit constituting the another sensor circuit to an outside; and
another secondary lead terminal electrically draws out a terminal of a second secondary detection circuit separable from the second primary detection circuit of the another sensor circuit to an outside.

* * * * *